(12) United States Patent
Baba et al.

(10) Patent No.: US 9,515,005 B2
(45) Date of Patent: Dec. 6, 2016

(54) PACKAGE MOUNTING STRUCTURE

(71) Applicant: FUJITSU LIMITED, Kawasaki-shi, Kanagawa (JP)

(72) Inventors: Shunji Baba, Yokohama (JP); Masateru Koide, Kawasaki (JP); Manabu Watanabe, Yokohama (JP); Takashi Kanda, Kawasaki (JP); Kenji Fukuzono, Kawasaki (JP); Yuki Hoshino, Kawasaki (JP); Makoto Suwada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 151 days.

(21) Appl. No.: 14/269,524

(22) Filed: May 5, 2014

(65) Prior Publication Data

US 2014/0376187 A1    Dec. 25, 2014

(30) Foreign Application Priority Data

Jun. 19, 2013    (JP) ................................ 2013-128507

(51) Int. Cl.
| | | |
|---|---|---|
| *H01L 23/473* | (2006.01) | |
| *H05K 1/02* | (2006.01) | |
| *H05K 1/18* | (2006.01) | |

(52) U.S. Cl.
CPC ............ *H01L 23/473* (2013.01); *H05K 1/021* (2013.01); *H01L 2924/0002* (2013.01); *H05K 1/181* (2013.01)

(58) Field of Classification Search
CPC .................. H05K 7/20927; H05K 1/16; H05K 2201/10106; H05K 1/053; H05K 3/0061; H05K 1/021; H05K 1/181; H05K 7/209; G06F 11/2015; G06F 11/2056; G06F 19/3437; G06F 19/3456; G06F 1/26

USPC ....... 361/679.46, 679.53, 689, 699, 701–703
See application file for complete search history.

(56) References Cited

U.S. PATENT DOCUMENTS

| | | | |
|---|---|---|---|
| 6,351,384 B1 | 2/2002 | Daikoku et al. | |
| 2003/0133268 A1* | 7/2003 | Radosevich | H02M 1/44 361/704 |
| 2008/0160246 A1* | 7/2008 | Buhler | H01L 23/3735 428/99 |
| 2010/0321889 A1* | 12/2010 | Yoshino | H05K 7/20927 361/702 |

(Continued)

FOREIGN PATENT DOCUMENTS

| | | |
|---|---|---|
| JP | 2001-053206 | 2/2001 |
| JP | 2010/267945 | 11/2010 |

OTHER PUBLICATIONS

Translation of Relevant part of Japanese Reference 62-32592U published Feb. 26, 1987.

*Primary Examiner* — Adam B Dravininkas
(74) *Attorney, Agent, or Firm* — Staas & Halsey LLP

(57) ABSTRACT

A package mounting structure includes: a first substrate having wiring; a second substrate having wiring; at least one cooling unit having a first face and a second face different from the first face; at least one power supply unit that is mounted on the first substrate and is joined to the first face of the cooling unit; and at least one electronic component that is mounted on the second substrate and is joined to the second face of the cooling unit, wherein the power supply unit supplies power to the electronic component through the wiring of the first substrate, the cooling unit, and the wiring of the second substrate.

6 Claims, 18 Drawing Sheets

(56) References Cited

U.S. PATENT DOCUMENTS

2012/0033385 A1 2/2012 Nagasawa
2013/0223010 A1* 8/2013 Shioga .................... H01L 23/13
　　　　　　　　　　　　　　　　　　　　　　　361/700

* cited by examiner

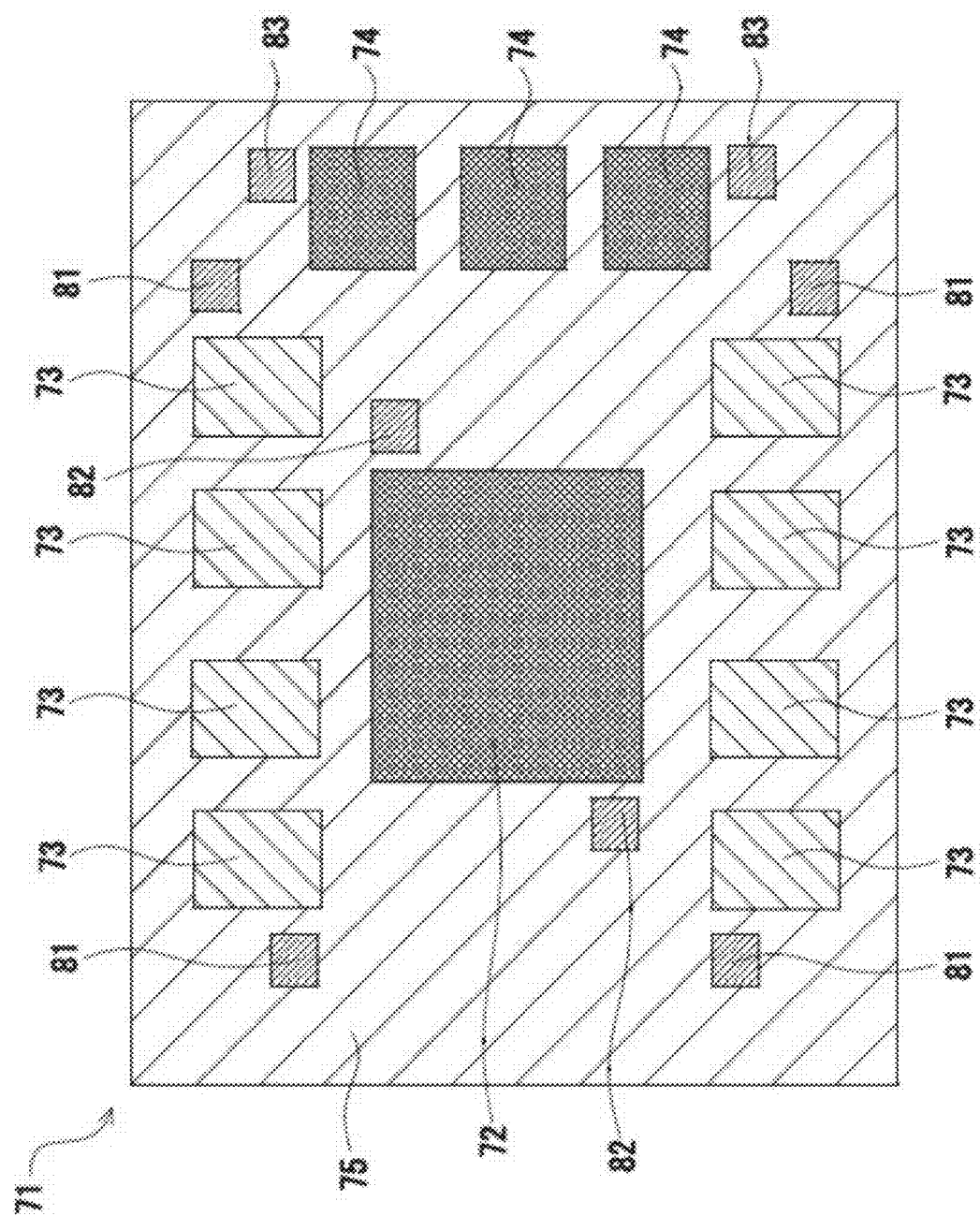

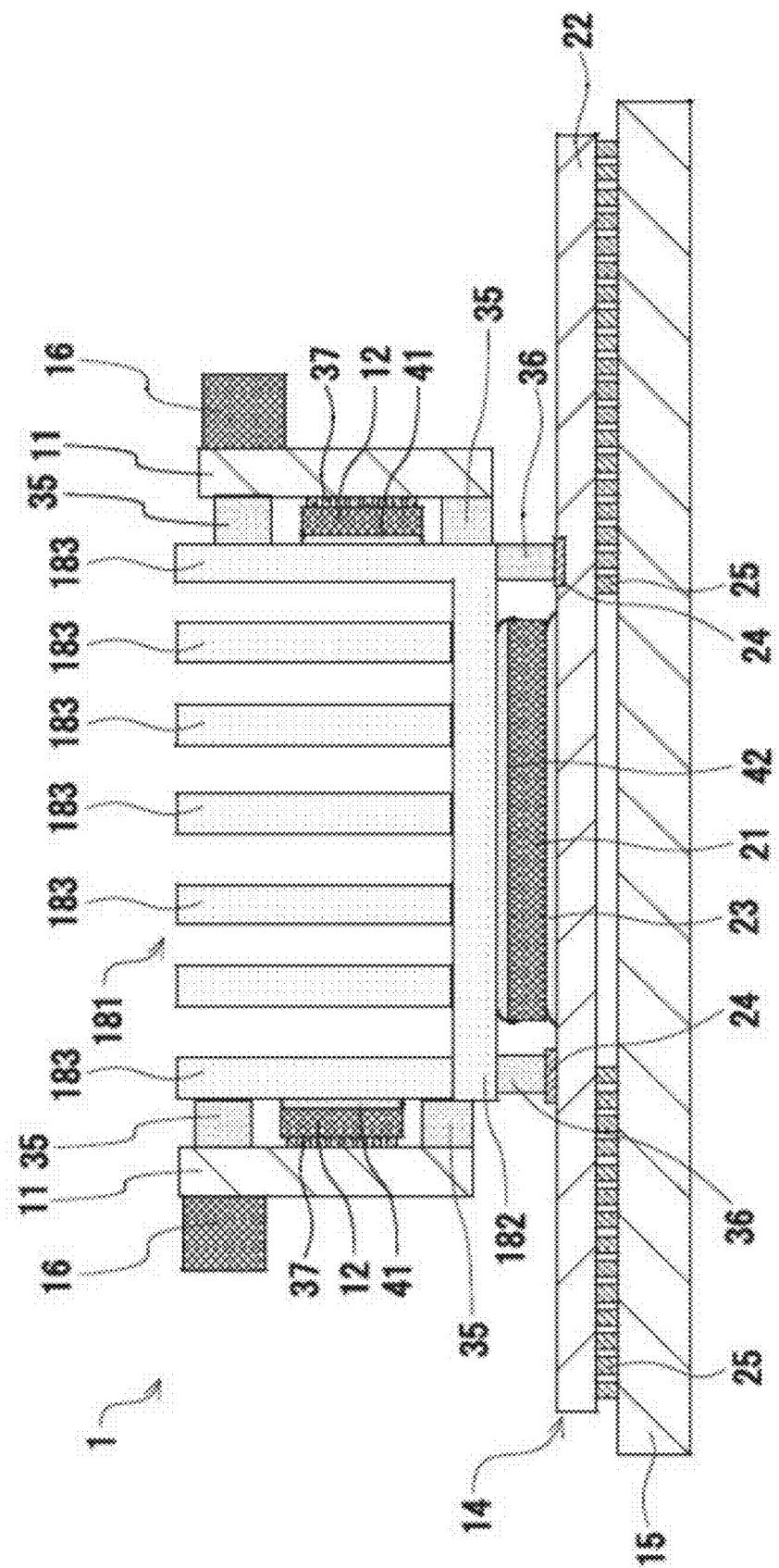

ns, as claimed.

PACKAGE MOUNTING STRUCTURE

CROSS-REFERENCE TO RELATED APPLICATION

This application is based upon and claims the benefit of priority of the prior Japanese Patent Application No. 2013-128507, filed on Jun. 19, 2013, the entire contents of which are incorporated herein by reference.

FIELD

The embodiments discussed herein are related to a package mounting structure.

BACKGROUND

In a package mounting structure, electronic components such as a central processing unit (CPU) package, a memory, an input and output (I/O) portion, a power supply portion and a connector, are separately implemented on a system board (motherboard). A cooler is attached to the CPU package, the memory, the I/O portion, and the power supply portion, if desired.

On the system board, the CPU package and the power supply portion are horizontally placed. Inside the system board, a power supply path is arranged and power is supplied to the CPU. Furthermore, from a demand for high speed transmission, there are considerations that the memory and the I/O portion are mounted on the CPU package, and the memory and the I/O portion are positioned close to the CPU.

In recent years, while power consumption of the CPU or the memory increases, an operating voltage tends to be low. Therefore, a supply current value to the CPU or the memory becomes large, and a voltage drop (drop in a power supply voltage) is generated due to sheet resistance in case of supplying the power to the CPU through the power supply path inside the system board.

Moreover, inside the system board, a via for transmitting a signal from the CPU package is arranged. When the via for the signal intersects with a power layer inside the system board and a ground layer, a clearance is set on the power layer and the ground layer. If the clearance is set on the power layer and the ground layer, areas for the power layer and the ground layer decrease, and the voltage drop increases. If the via for the signal is arranged outside of the power layer and the ground layer so that the via for the signal does not intersect with the power layer and the ground layer, a signal terminal of a package substrate is also extended outside thereof and the area of the package substrate becomes large.

The following are reference documents.
[Document 1] Japanese Examined Utility Model Registration Application Publication No. 62-32592,
[Document 2] Japanese Laid-open Patent Publication No. 2010-267945, and
[Document 3] Japanese Laid-open Patent Publication No. 2001-53206.

SUMMARY

According to an aspect of the invention, a package mounting structure includes: a first substrate having wiring; a second substrate having wiring; at least one cooling unit having a first face and a second face different from the first face; at least one power supply unit that is mounted on the first substrate and is joined to the first face of the cooling unit; and at least one electronic component that is mounted on the second substrate and is joined to the second face of the cooling unit, wherein the power supply unit supplies power to the electronic component through the wiring of the first substrate, the cooling unit, and the wiring of the second substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a plan view of a semiconductor package according to Example 3;
FIG. 18 is a diagram illustrating the package mounting structure according to Modification 2.

DESCRIPTION OF EMBODIMENTS

Hereinafter, a package mounting structure (package mounting substrate) according to an embodiment will be described, with reference to the drawings. The following configurations of Example 1 to Example 7, Modification 1, and Modification 2 are used as an example, and the package mounting structure according to the embodiment is not limited to the configurations of Example 1 to Example 7, Modification 1, and Modification 2. The package mounting structure according to the embodiment may be executed appropriately in combination with Example 1 to Example 7, Modification 1, and Modification 2.

Example 1

Figure 1:
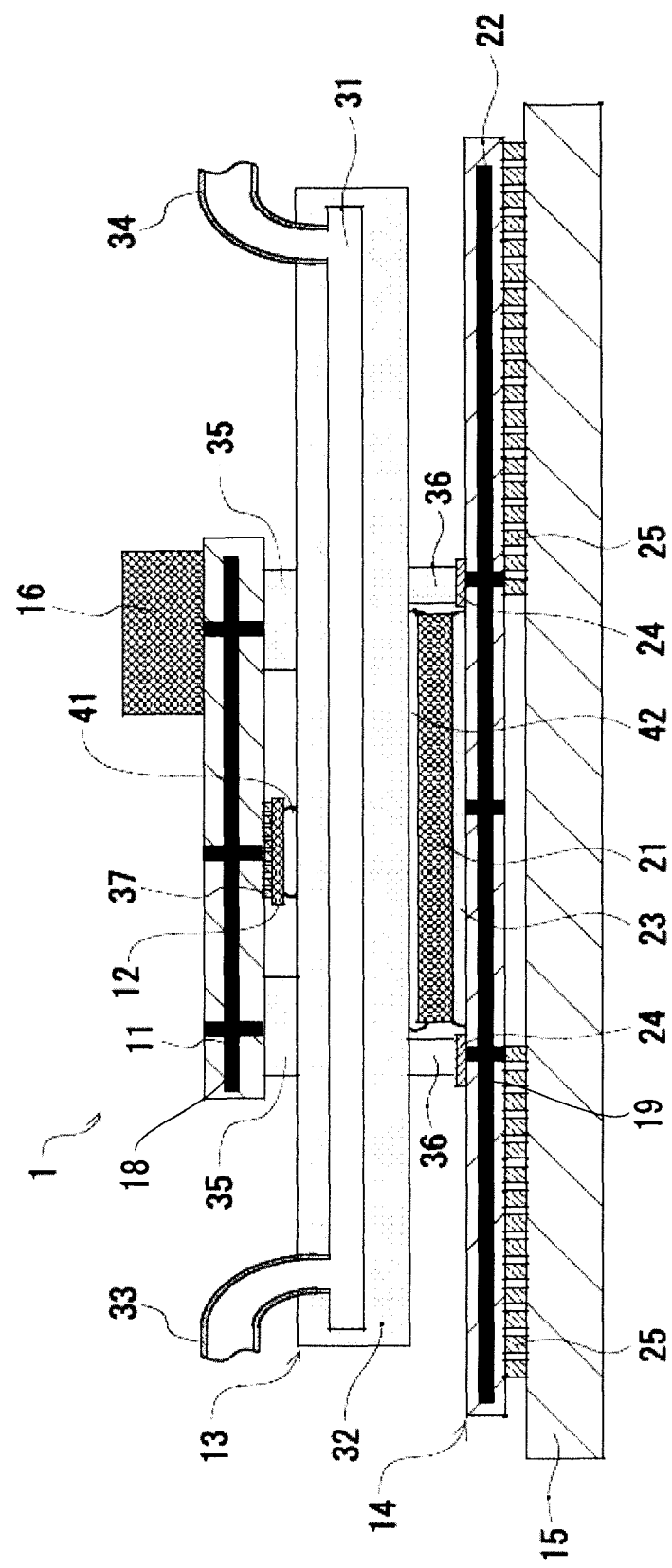
FIG. 1 is a diagram illustrating a package mounting structure according to Example 1.
Figure 2:
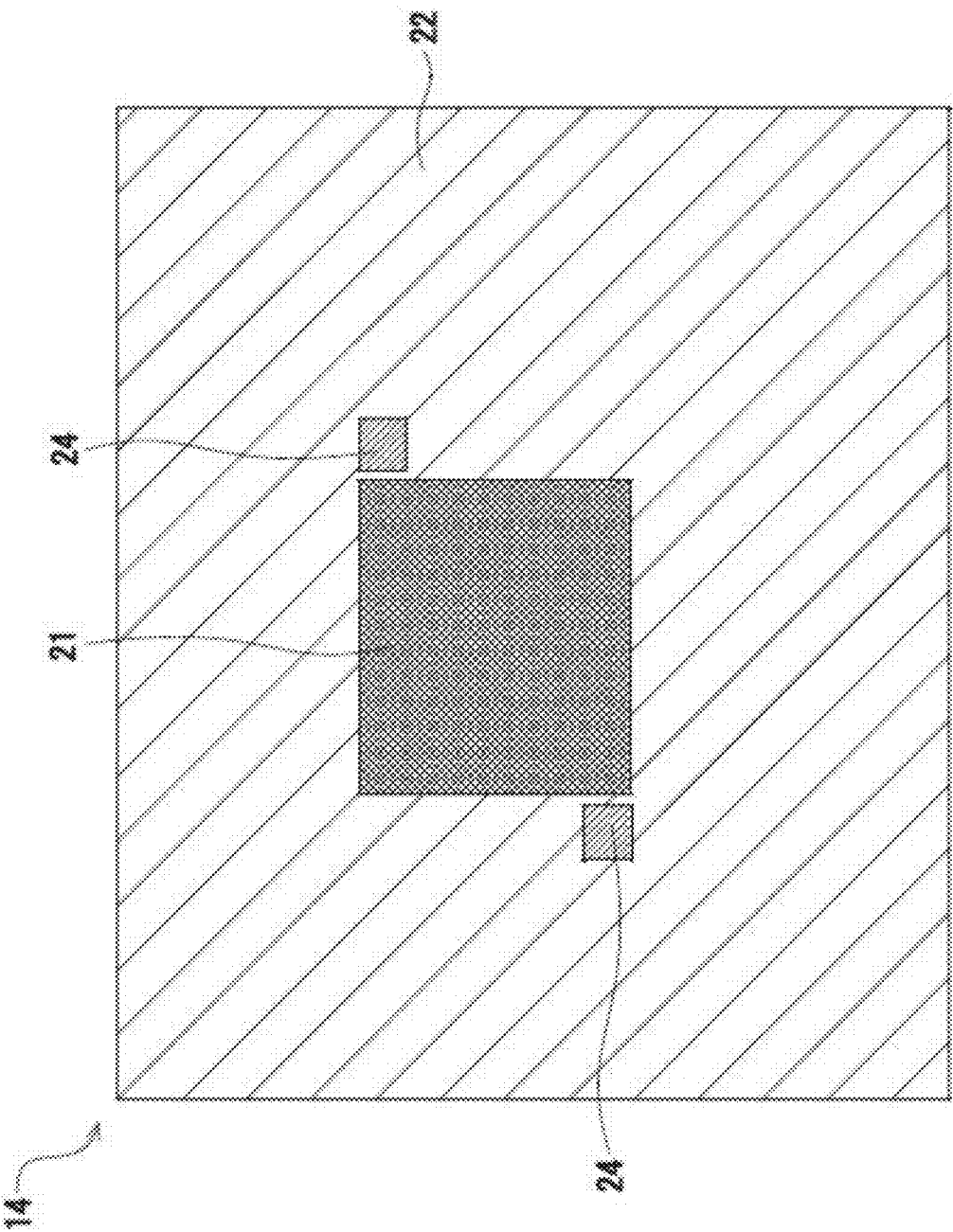
FIG. 2 is a plan view of a semiconductor package according to Example 1.

With reference to FIG. 1 and FIG. 2, a package mounting structure 1 according to Example 1 will be described. FIG. 1 is a diagram illustrating the package mounting structure 1 according to Example 1. The package mounting structure 1 according to Example 1 includes a power supply substrate 11, a power supply portion 12, a cooler (cooling device) 13, a semiconductor package 14, and a system board 15. The power supply substrate 11 is an example of a first substrate. The power supply portion 12 is an example of a power supply unit. The cooler 13 is an example of a cooling unit. The semiconductor package 14 is mounted on the system board 15. The system board 15 is also referred to as a motherboard. The system board 15 is, for example, a printed wiring board. The semiconductor package 14 is, for example, a CPU package.

The semiconductor package 14 has a semiconductor chip 21 and a package substrate 22. The semiconductor chip 21 is an example of an electronic component. The semiconductor chip 21 is, for example, a CPU chip. The package substrate 22 is, for example, a multilayer resin substrate. The package substrate 22 is an example of a second substrate. FIG. 2 is a plan view of the semiconductor package 14 according to Example 1. The semiconductor chip 21 is a flip chip which is joined to an upper face (surface) of the package substrate 22. That is, the semiconductor chip 21 is arranged on the package substrate 22 so that a circuit face of the semiconductor chip 21 is opposed to the upper face of the package substrate 22. An underfill resin 23 is filled between the semiconductor chip 21 and the package substrate 22.

On the upper face of the package substrate 22, a power pad 24 is arranged in the vicinity of the semiconductor chip 21. Inside the package substrate 22, power wiring 19 is formed. The power pad 24 is electrically connected to the power wiring 19 of the package substrate 22. The semiconductor chip 21 is electrically connected to the power pad 24 of the package substrate 22 through the power wiring 19 of the package substrate 22. On a lower face (back face) of the package substrate 22, a plurality of bumps (external terminals) 25 are arranged. The bumps 25 are, for example, solder balls. The semiconductor package 14 is electrically connected to the system board 15, through the bumps 25.

The cooler 13 is arranged on the semiconductor package 14. The cooler 13 has a flow path 31 through which a refrigerant flows, and a side wall 32 which surrounds the flow path 31. On the cooler 13, an inlet 33 where the refrigerant flows into the flow path 31, and an outlet 34 where the refrigerant flows out from the flow path 31 are arranged. Pipes (not illustrated) are arranged on the inlet 33 and the outlet 34, and the refrigerant circulates in the flow path 31 through the pipes. The cooler 13 is made of a metal material such as copper (Cu) having electrical conductivity. The refrigerant which flows through the flow path 31, is a liquid having insulating properties (non-conductivity).

The power supply substrate 11 and the power supply portion 12 are arranged on the cooler 13. The power supply substrate 11 is placed on the upper face of the cooler 13. The upper face thereof is an example of a first face. Between the power supply substrate 11 and the cooler 13, a column 35 is arranged on the side wall 32 of the cooler 13. In other words, the column 35 is formed on the upper face of the cooler 13. The column 35 of the cooler 13 is made of a metal material such as copper having electrical conductivity. Inside the power supply substrate 11, the power wiring 18 is formed. The cooler 13 is electrically connected to the power wiring 18 of the power supply substrate 11, through the column 35 on the cooler 13.

The power supply portion 12 is mounted on the power supply substrate 11. The power supply portion 12 is, for example, a DC-DC converter. On the upper face (surface) of the power supply portion 12, a plurality of bumps (external terminals) 37 are arranged. The bumps 37 are, for example, solder balls. The power supply portion 12 is electrically connected to the power wiring 18 of the power supply substrate 11, through the bumps 37. A connector 16 is arranged on the power supply substrate 11. After converting a voltage of power which is supplied through a power plug (not illustrated) connected to the connector 16 into the voltage which is suitable for the semiconductor chip 21, the power supply portion 12 supplies power to the semiconductor chip 21.

The power supply portion 12 is placed on the upper face of the cooler 13, and is joined to the upper face of the cooler 13. A joining member 41 is arranged between the power supply portion 12 and the cooler 13. The joining member 41 has thermal conductivity. The joining member 41 is, for example, a thermal sheet or paste-formed grease. The cooler 13 cools the power supply portion 12. That is, heat which is generated in the power supply portion 12 is transmitted to the cooler 13, through the joining member 41, and thereby the power supply portion 12 is cooled.

The semiconductor chip 21 is placed on the lower face of the cooler 13, and is joined to the lower face of the cooler 13. That is, the semiconductor chip 21 is joined to the face (lower face) of the cooler 13 different from the face (upper face) to which the power supply portion 12 is joined. The lower face is the face opposite to the upper face, and an example of a second face. A joining member 42 is arranged between the cooler 13 and the semiconductor chip 21. The joining member 42 has the thermal conductivity. The joining member 42 is, for example, the thermal sheet or the paste-formed grease. The cooler 13 cools the semiconductor chip 21. That is, the heat which is generated in the semiconductor chip 21 is transmitted to the cooler 13, through the joining member 42, and thereby the semiconductor chip 21 is cooled.

Between the cooler 13 and the package substrate 22, a column 36 is arranged on the side wall 32 of the cooler 13. In other words, the column 36 is formed on the lower face of the cooler 13. The column 36 of the cooler 13 is made of a metal material such as copper having electrical conductivity. The column 36 of the cooler 13 is connected to the power pad 24 of the package substrate 22, by soldering. The cooler 13 is electrically connected to the power wiring 19 of the package substrate 22, through the column 36 of the cooler 13 and the power pad 24 of the package substrate 22.

The power supply portion 12 is electrically connected to the cooler 13, through the power wiring 18 of the power supply substrate 11 and the column 35 of the cooler 13. The cooler 13 is electrically connected to the semiconductor chip 21, through the column 36 of the cooler 13, the power pad 24 of the package substrate 22, and the power wiring 19 of the package substrate 22. Therefore, the power supply portion 12 supplies power to the semiconductor chip 21, through the power wiring 18 of the power supply substrate 11, the cooler 13, and the power wiring 19 of the package substrate 22. More specifically, the power supply portion 12 supplies power to the semiconductor chip 21, through the power wiring 18 of the power supply substrate 11, the column 35 of the cooler 13, the side wall 32 of the cooler 13, the column 36 of the cooler 13, the power pad 24 of the package substrate 22, and the power wiring 19 of the package substrate 22.

According to Example 1, the power supply portion 12 supplies power to the semiconductor chip 21, through a power supply channel including the power wiring 18 of the power supply substrate 11, the cooler 13, and the power wiring 19 of the package substrate 22. Thereby, without going through the system board 15, power is supplied to the semiconductor chip 21. Therefore, it is possible to exclude formation of a power layer in the system board 15, and a voltage drop in power supply to the semiconductor chip 21 is suppressed. According to Example 1, by the cooler 13, it is possible to cool the power supply portion 12 and the semiconductor chip 21 at the same time. Therefore, since a cooling system that cools the power supply portion 12 and the semiconductor chip 21 may be made as a single system, it is possible to simplify the structure of the package mounting structure 1.

Example 2

With reference to FIG. 3 to FIG. 5C, the package mounting structure 1 according to Example 2 will be described. In the package mounting structure 1 according to Example 2, an example of electrically dividing (separating) a side wall 53 of a cooler (cooling device) 51 by an insulating portion 56 and plural supplying the power to the semiconductor chip 21, will be described. In Example 2, the same reference numerals as those of Example 1 are attached to the same components as those of Example 1, and the descriptions thereof are excluded.

Figure 3:
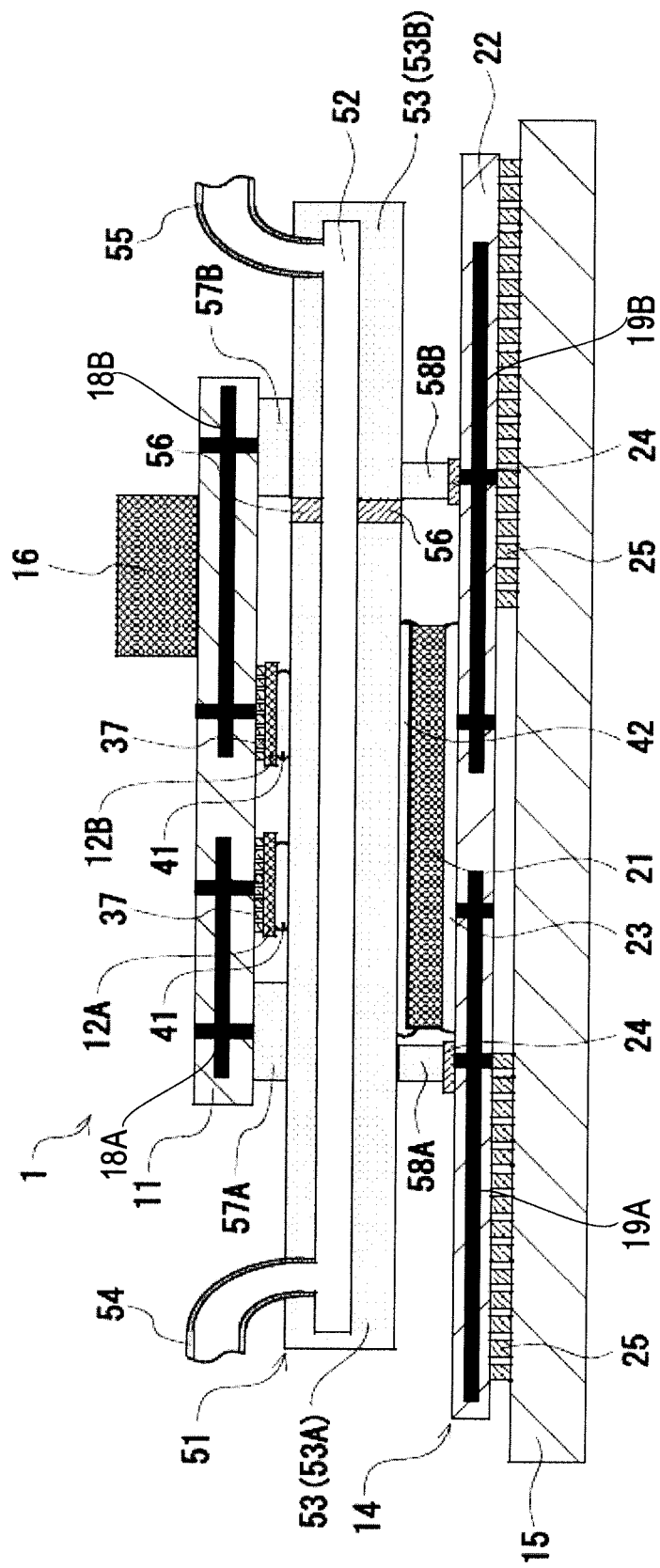
FIG. 3 is a diagram illustrating a package mounting structure according to Example 2.

FIG. 3 is a diagram illustrating the package mounting structure 1 according to Example 2. The package mounting structure 1 according to Example 2 includes the power supply substrate 11, power supply portions 12A and 12B, the cooler 51, the semiconductor package 14, and the system board 15. The power supply portions 12A and 12B are examples of the power supply unit. The cooler 51 is an example of the cooling unit.

The cooler 51 is arranged on the semiconductor package 14. The cooler 51 has a flow path 52 through which the refrigerant flows, and the side wall 53 (53A and 53B) which surrounds the flow path 52. On the cooler 51, an inlet 54 where the refrigerant flows into the flow path 52, and an outlet 55 where the refrigerant flows out from the flow path 52 are arranged. The pipes (not illustrated) are arranged on the inlet 54 and the outlet 55, and the refrigerant circulates in the flow path 52 through the pipes. The cooler 51 is made of a metal material such as copper having electrical conductivity. The refrigerant which flows through the flow path 52, is the refrigerant having the insulating properties.

Figure 4A:
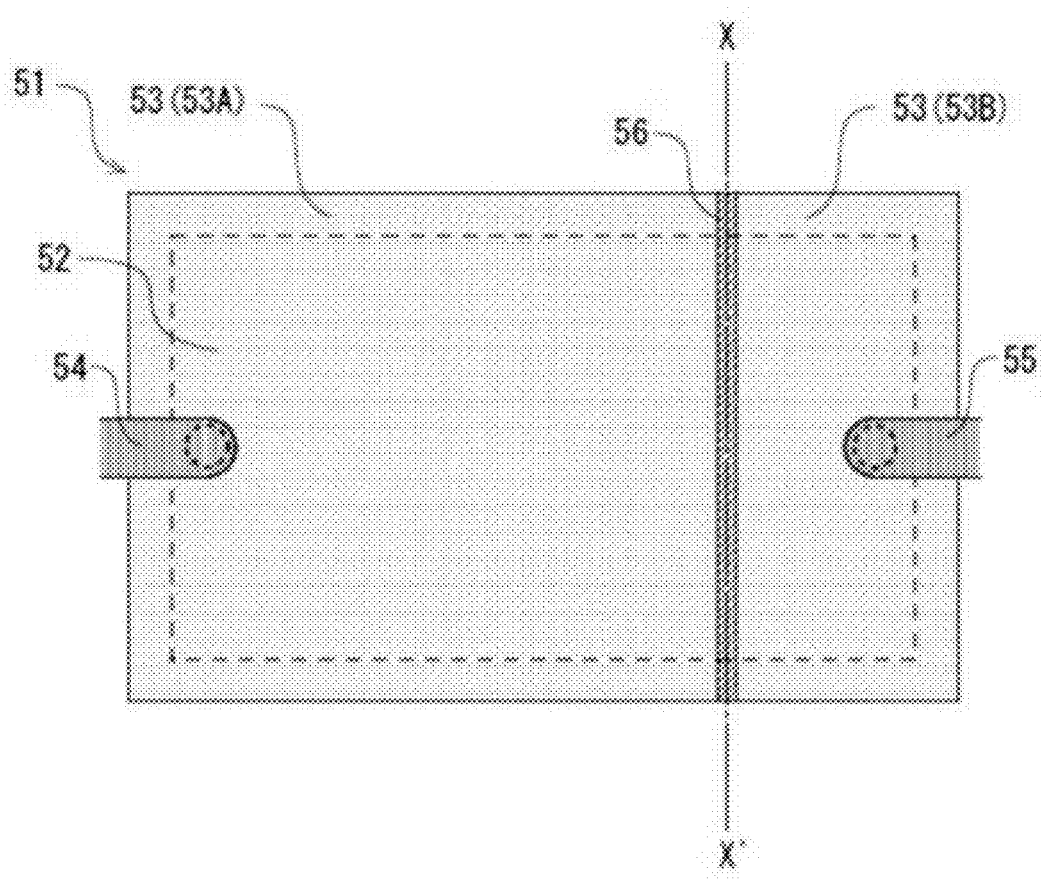
FIG. 4A is a plan view of a cooler according to Example 2.
Figure 4B:
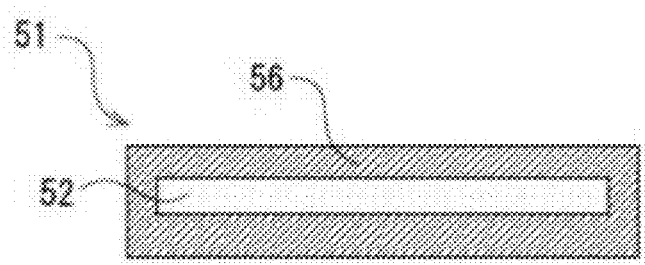
FIG. 4B is a sectional view of the cooler according to Example 2 illustrating a section along an alternate long and short dash line X-X' of FIG. 4A.

FIG. 4A is a plan view of the cooler 51 according to Example 2, and FIG. 4B is a sectional view of the cooler 51 according to Example 2 illustrating a section along an alternate long and short dash line X-X' of FIG. 4A. The side wall 53 of the cooler 51 is electrically divided by the insulating portion 56. The insulating portion 56 is made of the resin having the insulating properties, for example, an epoxy resin. As illustrated in FIG. 4A and FIG. 4B, since the flow path 52 is linked from the inlet 54 toward the outlet 55, the refrigerant flows inside the flow path 52.

Figure 5A:
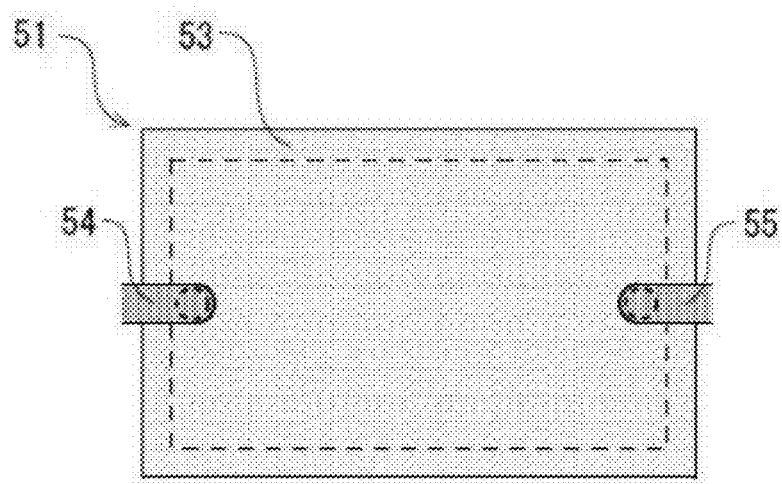
FIGS. 5A, 5B, and 5C are diagrams illustrating a method of preparing the cooler according to Example 2.
Figure 5B:
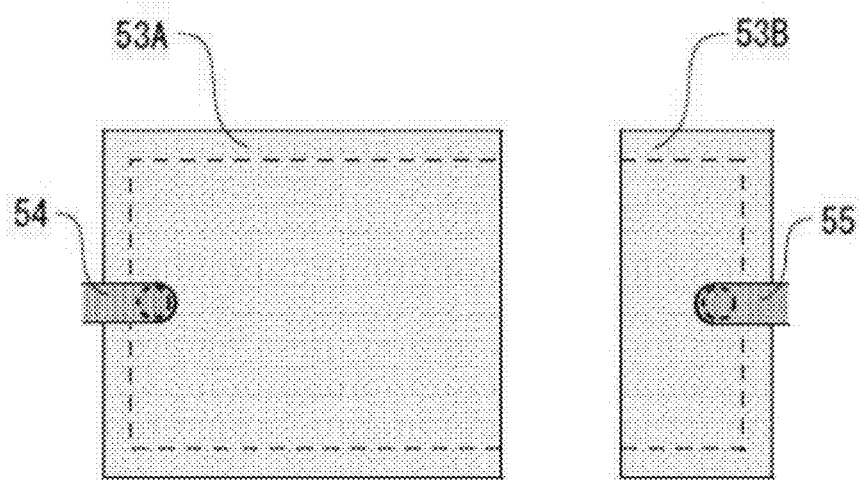
Figure 5C:
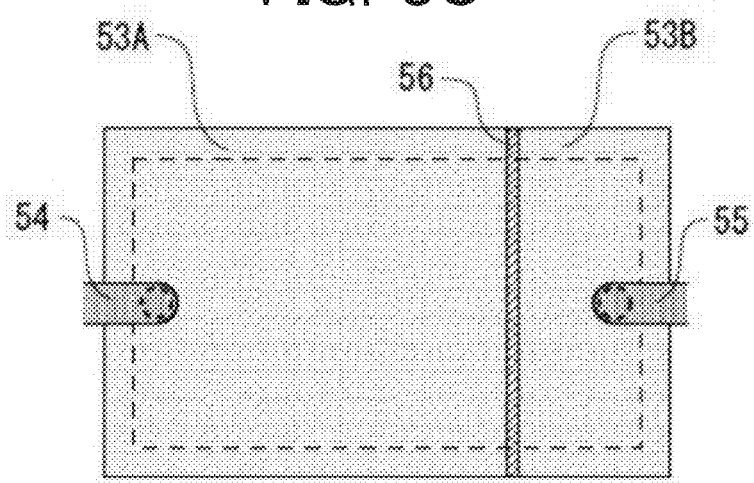

FIGS. 5A, 5B, and 5C are diagrams illustrating a method of preparing the cooler 51 according to Example 2. First, as illustrated in FIG. 5A, the cooler 51 having the flow path 52 and the side wall 53, is created. Next, as illustrated in FIG. 5B, by cutting the side wall 53 of the cooler 51, the side wall 53 of the cooler 51 is divided into the side walls 53A and 53B. Subsequently, as illustrated in FIG. 5C, the side wall 53A and the side wall 53B are bonded by the insulating portion 56.

Returning to the description of FIG. 3, the power supply substrate 11 and the power supply portions 12A and 12B are arranged on the cooler 51. The power supply substrate 11 is placed on the upper face of the cooler 51. Between the power supply substrate 11 and the cooler 51, a column 57A is arranged on the side wall 53A of the cooler 51, and a column 57B is arranged on the side wall 53B of the cooler 51. In other words, the columns 57A and 57B are formed on the upper face of the cooler 51. The columns 57A and 57B of the cooler 51 are made of a material metal such as copper having electrical conductivity. The cooler 51 is electrically connected to the power wiring-wirings 18A and 18B of the power supply substrate 11, through the columns 57A and 57B of the cooler 51.

The power supply portions 12A and 12B are mounted on the power supply substrate 11. The power supply portions 12A and 12B are, for example, the DC-DC converters. On the upper faces (surfaces) of the power supply portions 12A and 12B, the plurality of bumps 37 are arranged. The power supply portions 12A and 12B are electrically connected to the power wirings 18A and 18B of the power supply substrate 11, through the bumps 37. The connector 16 is arranged on the power supply substrate 11. After converting the voltage of the power which is supplied through the power plug (not illustrated) connected to the connector 16 into the voltage which is suitable for the semiconductor chip 21, the power supply portions 12A and 12B supply the power to the semiconductor chip 21.

The power supply portions 12A and 12B are placed on the upper face of the cooler 51, and are joined to the upper face of the cooler 51. The joining member 41 is arranged between the power supply portions 12A and 12B and the cooler 51. The cooler 51 cools the power supply portions 12A and 12B. That is, the heat which is generated in the power supply portions 12A and 12B is transmitted to the cooler 51, through the joining member 41, and thereby the power supply portions 12A and 12B are cooled.

The semiconductor chip 21 is placed on the lower face of the cooler 51, and is joined to the lower face of the cooler 51. That is, the semiconductor chip 21 is joined to the face (lower face) of the cooler 51 different from the face (upper face) to which the power supply portions 12A and 12B are joined. The joining member 42 is arranged between the cooler 51 and the semiconductor chip 21. The cooler 51 cools the semiconductor chip 21. That is, the heat which is generated in the semiconductor chip 21 is transmitted to the cooler 51, through the joining member 42, and thereby the semiconductor chip 21 is cooled.

Between the cooler 51 and the package substrate 22, a column 58A is arranged on the side wall 53A of the cooler 51, and a column 58B is arranged on the side wall 53B of the cooler 51. In other words, the columns 58A and 58B are formed on the lower face of the cooler 51. The columns 58A and 58B of the cooler 51 are made of a metal material such as copper having electrical conductivity. The columns 58A and 58B of the cooler 51 are connected to the power pad 24 of the package substrate 22, by soldering. The cooler 51 is electrically connected to the power wirings 19A and 19B of the package substrate 22, through the columns 58A and 58B of the cooler 51 and the power pad 24 of the package substrate 22.

The power supply portion 12A is electrically connected to the cooler 51, through the power wiring 18A of the power supply substrate 11 and the column 57A of the cooler 51. The cooler 51 is electrically connected to the semiconductor chip 21, through the column 58A of the cooler 51, the power pad 24 of the package substrate 22 and the power wiring 19B of the package substrate 22. Therefore, the power supply portion 12A supplies power to the semiconductor chip 21, through the power wiring 18A of the power supply substrate 11, the cooler 51, and the power wiring 19A of the package substrate 22. More specifically, the power supply portion 12A supplies power to the semiconductor chip 21, through the power wiring 18A of the power supply substrate 11, the column 57A of the cooler 51, the side wall 53A of the cooler 51, the column 58A of the cooler 51, the power pad 24 of the package substrate 22, and the power wiring 19A of the package substrate 22.

The power supply portion 12B is electrically connected to the cooler 51, through the power wiring 18B of the power supply substrate 11 and the column 57B of the cooler 51. The cooler 51 is electrically connected to the semiconductor chip 21, through the column 58B of the cooler 51, the power pad 24 of the package substrate 22, and the power wiring 19B of the package substrate 22. Therefore, the power supply portion 12B supplies power to the semiconductor chip 21, through the power wiring 18B of the power supply substrate 11, the cooler 51, and the power wiring 19B of the package substrate 22. More specifically, the power supply portion 12B supplies power to the semiconductor chip 21, through the power wiring 18B of the power supply substrate 11, the column 57B of the cooler 51, the side wall 53B of the cooler 51, the column 58B of the cooler 51, the power pad 24 of the package substrate 22, and the power wiring 19B of the package substrate 22.

In Example 2, the side wall 53 of the cooler 51 is electrically divided by the insulating portion 56, and thereby a plurality of power paths is formed in the cooler 51. Accordingly, the plurality of the power supply channels is formed with respect to the semiconductor chip 21. That is, the power supply channel where the power supply portion 12A supplies power to the semiconductor chip 21 and the power supply channel where the power supply portion 12B supplies power to the semiconductor chip 21, are formed. Thus, the power supply portions 12A and 12B supply the power to the semiconductor chip 21, through the plurality of the power supply channels including the power wirings 18A and 18B of the power supply substrate 11, the plurality of the power paths which are formed in the cooler 51 and the power wirings 19A and 19B of the package substrate 22. Thereby, without going through the system board 15, power is supplied to the semiconductor chip 21. Therefore, it is possible to exclude the formation of the power layer in the system board 15, and the voltage drop in the power supply to the semiconductor chip 21 is suppressed. According to Example 2, by the cooler 51, it is possible to cool the power supply portions 12A and 12B and the semiconductor chip 21 at the same time. Consequently, since the cooling system that cools the power supply portions 12A and 12B and the semiconductor chip 21 may be made as a single system, it is possible to simplify the structure of the package mounting structure 1.

The power supply channel where the power supply portion 12A supplies power to the semiconductor chip 21 is the different channel from the power supply channel where the power supply portion 12B supplies power to the semiconductor chip 21. A voltage value in case of supplying the power to the semiconductor chip 21 by the power supply portion 12A, may be the same value or the different value, as the voltage value in case of supplying the power to the semiconductor chip 21 by the power supply portion 12B. For example, if the power supply portion 12A is the voltage of 1.5 V and supplies power to the semiconductor chip 21, the power supply portion 12B may be the voltage of 3 V and supply the power to the semiconductor chip 21.

Example 3

With reference to FIG. 6 to FIG. 8B, the package mounting structure 1 according to Example 3 will be described. In the package mounting structure 1 according to Example 3, an example of supplying the power to the electronic components of a plurality of types, will be described. In Example 3, the same reference numerals as those of Example 1 and Example 2 are attached to the same components as those of Example 1 and Example 2, and the descriptions thereof are excluded.

Figure 6:
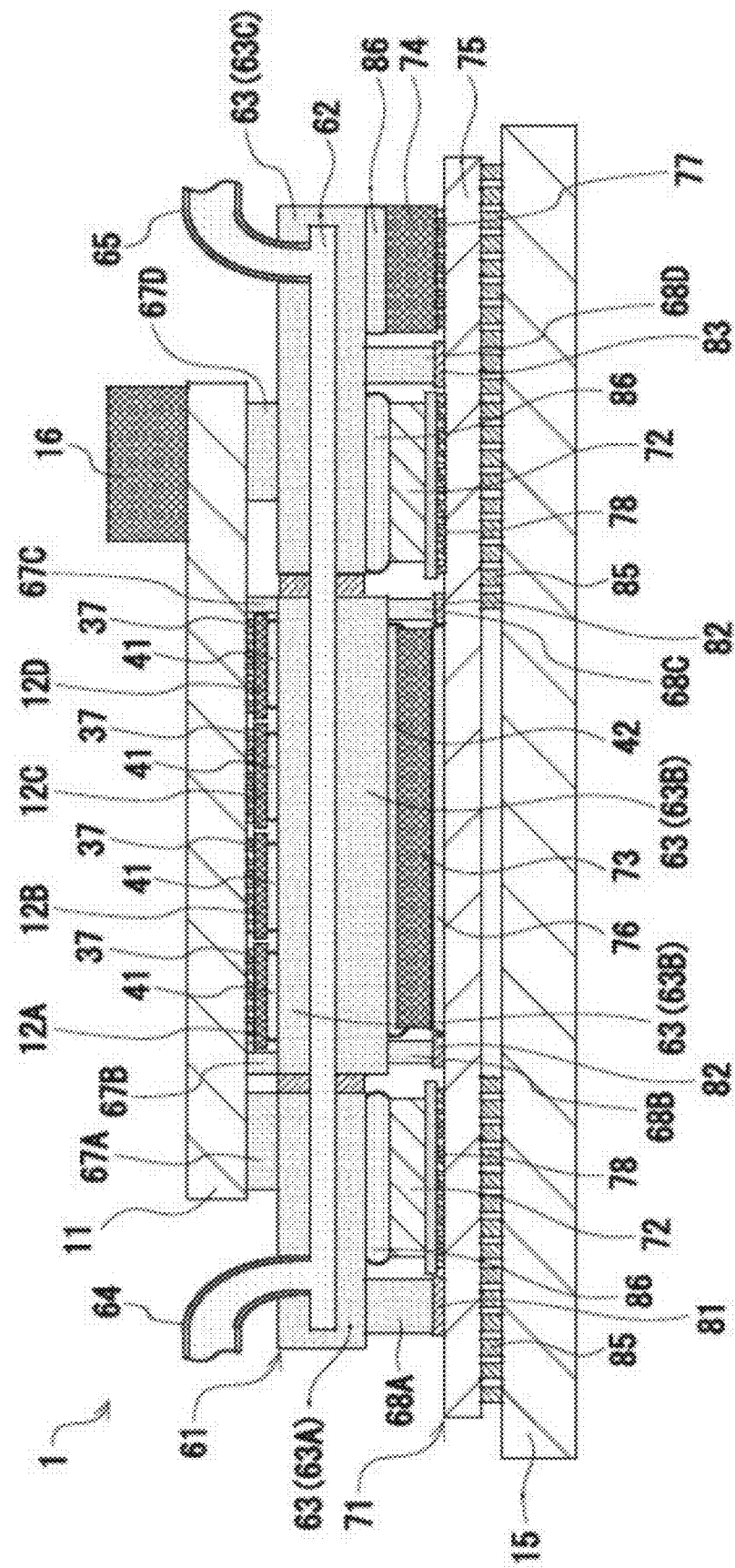
FIG. 6 is a diagram illustrating a package mounting structure according to Example 3.

FIG. 6 is a diagram illustrating the package mounting structure 1 according to Example 3. The package mounting structure 1 according to Example 3 includes the power supply substrate 11, the power supply portions 12A to 12D, a cooler (cooling device) 61, a semiconductor package 71, and the system board 15. The power supply portions 12A to 12D are examples of the power supply unit. The cooler 61 is an example of the cooling unit. The semiconductor package 71 is mounted on the system board 15.

The semiconductor package 71 has a memory 72, a semiconductor chip 73, an I/O portion 74, and a package substrate 75. The memory 72, the semiconductor chip 73, and the I/O portion 74 are examples of the electronic component. The semiconductor chip 73 is, for example, the CPU chip. The package substrate 75 is, for example, the multilayer resin substrate. The package substrate 75 is an example of the second substrate. FIG. 7 is a plan view of the semiconductor package 71 according to Example 3. The semiconductor chip 73 is a flip chip which is joined to an upper face (surface) of the package substrate 75. That is, the semiconductor chip 73 is arranged on the package substrate 75 so that the circuit face of the semiconductor chip 73 is opposed to the upper face of the package substrate 75. An underfill resin 76 is filled between the semiconductor chip 73 and the package substrate 75. The memory 72 and the I/O portion 74 are joined to the package substrate 75, through a bump 77.

On the upper face of the package substrate 75, a power pad 81 for the memory 72 is arranged in the vicinity of the memory 72. On the upper face of the package substrate 75, a power pad 82 for the semiconductor chip 73 is arranged in the vicinity of the semiconductor chip 73. On the upper face of the package substrate 75, a power pad 83 for the I/O portion 74 is arranged in the vicinity of the I/O portion 74.

Inside the package substrate 75, the power wiring (not illustrated) is formed. The power pads 81 to 83 are electrically connected to the power wiring of the package substrate 75. The memory 72 is electrically connected to the power pad 81 of the package substrate 75, through the power wiring of the package substrate 75. The semiconductor chip 73 is electrically connected to the power pad 82 of the package substrate 75, through the power wiring of the package substrate 75. The I/O portion 74 is electrically connected to the power pad 83 of the package substrate 75, through the power wiring of the package substrate 75.

On the lower face (back face) of the package substrate 75, a plurality of bumps (external terminals) 85 are arranged. The bump 85 is, for example, a solder ball. The semiconductor package 71 is electrically connected to the system board 15, through the bumps 85.

The cooler 61 is arranged on the semiconductor package 71. The cooler 61 has a flow path 62 through which the refrigerant flows, and a side wall 63 (63A, 63B, and 63C) which surrounds the flow path 62. On the cooler 61, an inlet 64 where the refrigerant flows into the flow path 62, and an outlet 65 where the refrigerant flows out from the flow path 62 are arranged. The pipes (not illustrated) are arranged on the inlet 64 and the outlet 65, and the refrigerant circulates in the flow path 62 through the pipes. The cooler 61 is made of a metal material such as copper (Cu) having electrical conductivity. The refrigerant which flows through the flow path 62, is the liquid having the insulating properties.

Figure 8A:
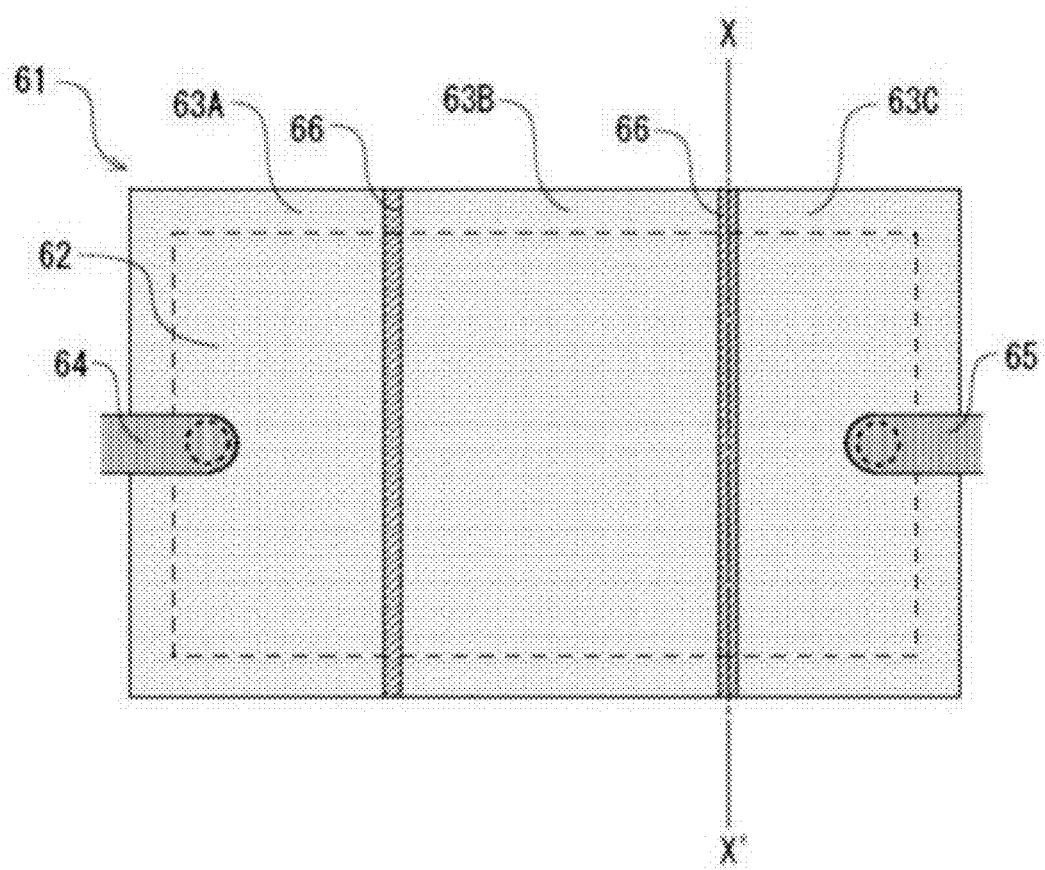
FIG. 8A is a plan view of a cooler according to Example 3.
Figure 8B:
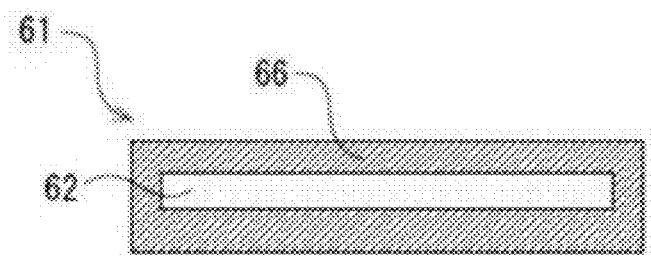
FIG. 8B is a sectional view of the cooler according to Example 3 illustrating a section along an alternate long and short dash line X-X' of FIG. 8A.

FIG. 8A is a plan view of the cooler 61 according to Example 3, and FIG. 8B is a sectional view of the cooler 61 according to Example 3 illustrating a section along an alternate long and short dash line X-X' of FIG. 8A. The side wall 63 of the cooler 61 is electrically divided by an insulating portion 66. The insulating portion 66 is made of the resin having the insulating properties, for example, the epoxy resin. As illustrated in FIG. 8A and FIG. 8B, since the flow path 62 is linked from the inlet 64 toward the outlet 65, the refrigerant flows inside the flow path 62.

The power supply substrate 11 and the power supply portions 12A to 12D are arranged on the cooler 61. The power supply substrate 11 is placed on the upper face of the cooler 61. Between the power supply substrate 11 and the cooler 61, a column 67A is arranged on the side wall 63A of the cooler 61, columns 67B and 67C are arranged on the side wall 63B of the cooler 61, and a column 67D is arranged on the side wall 63C of the cooler 61. In other words, the columns 67A to 67D are formed on the upper face of the cooler 61. The columns 67A to 67D of the cooler 61 are made of a metal material such as copper having electrical conductivity. The cooler 61 is electrically connected to the power wiring of the power supply substrate 11, through the columns 67A to 67D of the cooler 61.

The power supply portions 12A to 12D are mounted on the power supply substrate 11. The power supply portions 12A to 12D are, for example, the DC-DC converters. On the upper faces (surfaces) of the power supply portions 12A to 12D, the plurality of bumps 37 is arranged. The power supply portions 12A to 12D are electrically connected to the power wiring of the power supply substrate 11, through the bumps 37. The connector 16 is arranged on the power supply substrate 11.

After converting the voltage of the power which is supplied through the power plug (not illustrated) connected to the connector 16 into the voltage which is suitable for the memory 72, the power supply portion 12A supplies power to the memory 72. After converting the voltage of the power which is supplied through the power plug (not illustrated) connected to the connector 16 into the voltage which is suitable for the semiconductor chip 73, the power supply portions 12B and 12C supply the power to the semiconductor chip 73. After converting the voltage of the power which is supplied through the power plug (not illustrated) connected to the connector 16 into the voltage which is suitable for the I/O portion 74, the power supply portion 12D supplies power to the I/O portion 74.

The power supply portions 12A to 12D are placed on the upper face of the cooler 61, and are joined to the upper face of the cooler 61. The joining member 41 is arranged between the power supply portions 12A to 12D and the cooler 61. The cooler 61 cools the power supply portions 12A to 12D. That is, the heat which is generated in the power supply portions 12A to 12D is transmitted to the cooler 61, through the joining member 41, and thereby the power supply portions 12A to 12D are cooled.

The semiconductor chip 73 is placed on the lower face of the cooler 61, and is joined to the lower face of the cooler 61. That is, the semiconductor chip 73 is joined to the face (lower face) of the cooler 61 different from the face (upper face) to which the power supply portions 12A to 12D are joined. The joining member 42 is arranged between the cooler 61 and the semiconductor chip 73. The cooler 61 cools the semiconductor chip 73. That is, the heat which is generated in the semiconductor chip 73 is transmitted to the cooler 61, through the joining member 42, and thereby the semiconductor chip 73 is cooled.

The memory 72 and the I/O portion 74 are placed on the lower face of the cooler 61, and are joined to the lower face of the cooler 61. That is, the memory 72 and the I/O portion 74 are joined to the face (lower face) of the cooler 61 different from the face (upper face) to which the power supply portions 12A to 12D are joined. A joining member 86 is arranged between the cooler 61 and the memory 72 and the I/O portion 74. The cooler 61 cools the memory 72 and the I/O portion 74. That is, the heat which is generated in the memory 72 and the I/O portion 74 is transmitted to the cooler 61, through the joining member 86, and thereby the memory 72 and the I/O portion 74 are cooled.

Between the cooler 61 and the package substrate 75, a column 68A is arranged on the side wall 63A of the cooler 61, columns 68B and 68C are arranged on the side wall 63B of the cooler 61, and a column 68D is arranged on the side wall 63C of the cooler 61. In other words, the columns 68A to 68D are formed on the lower face of the cooler 61. The columns 68A to 68D of the cooler 61 are made of a metal material such as copper having electrical conductivity. The columns 68A to 68D of the cooler 61 are connected to the power pads 81 to 83 of the package substrate 75, by soldering. The cooler 61 is electrically connected to the power wiring of the package substrate 75, through the columns 68A to 68D of the cooler 61 and the power pads 81 to 83 of the package substrate 75.

The power supply portion 12A is electrically connected to the cooler 61, through the power wiring of the power supply substrate 11 and the column 67A of the cooler 61. The cooler 61 is electrically connected to the memory 72, through the column 68A of the cooler 61, the power pad 81 of the package substrate 75, and the power wiring of the package substrate 75. Therefore, the power supply portion 12A supplies power to the memory 72, through the power wiring of the power supply substrate 11, the cooler 61, and the power wiring of the package substrate 75. More specifically, the power supply portion 12A supplies power to the memory 72, through the power wiring of the power supply substrate 11, the column 67A of the cooler 61, the side wall 63A of the cooler 61, the column 68A of the cooler 61, the power pad 81 of the package substrate 75, and the power wiring of the package substrate 75.

The power supply portion 12B is electrically connected to the cooler 61, through the power wiring of the power supply substrate 11 and the column 67B of the cooler 61. The cooler 61 is electrically connected to the semiconductor chip 73, through the column 68B of the cooler 61, the power pad 82 of the package substrate 75, and the power wiring of the package substrate 75. Therefore, the power supply portion 12B supplies power to the semiconductor chip 73, through the power wiring of the power supply substrate 11, the cooler 61, and the power wiring of the package substrate 75. More specifically, the power supply portion 12B supplies power to the semiconductor chip 73, through the power wiring of the power supply substrate 11, the column 67B of the cooler 61, the side wall 63B of the cooler 61, the column 68B of the cooler 61, the power pad 82 of the package substrate 75, and the power wiring of the package substrate 75.

The power supply portion 12C is electrically connected to the cooler 61, through the power wiring of the power supply substrate 11 and the column 67C of the cooler 61. The cooler 61 is electrically connected to the semiconductor chip 73, through the column 68C of the cooler 61, the power pad 82 of the package substrate 75 and the power wiring of the package substrate 75. Therefore, the power supply portion 12C supplies power to the semiconductor chip 73, through the power wiring of the power supply substrate 11, the cooler 61, and the power wiring of the package substrate 75. More specifically, the power supply portion 12C supplies power to the semiconductor chip 73, through the power wiring of the power supply substrate 11, the column 67C of the cooler 61, the side wall 63B of the cooler 61, the column 68C of the cooler 61, the power pad 82 of the package substrate 75, and the power wiring of the package substrate 75.

The power supply portion 12D is electrically connected to the cooler 61, through the power wiring of the power supply substrate 11 and the column 67D of the cooler 61. The cooler 61 is electrically connected to the I/O portion 74, through the column 68D of the cooler 61, the power pad 83 of the package substrate 75, and the power wiring of the package substrate 75. Therefore, the power supply portion 12D supplies power to the I/O portion 74, through the power wiring of the power supply substrate 11, the cooler 61, and the power wiring of the package substrate 75. More specifically, the power supply portion 12D supplies power to the I/O portion 74, through the power wiring of the power supply substrate 11, the column 67D of the cooler 61, the side wall 63C of the cooler 61, the column 68D of the cooler 61, the power pad 83 of the package substrate 75, and the power wiring of the package substrate 75.

In Example 3, the side wall 63 of the cooler 61 is electrically divided by the insulating portion 66, and thereby the plurality of the power paths is formed in the cooler 61. Accordingly, the plurality of the power supply channels is formed with respect to the electronic components of the plurality of the types. That is, the power supply channel where the power supply portion 12A supplies power to the memory 72, the power supply channel where the power supply portion 12B and 12C supply the power to the semiconductor chip 73, and the power supply channel where the power supply portion 12D supplies power to the I/O portion 74, are formed. Thus, the power supply portions 12A to 12D supply the power to the electronic components of the plurality of the types, through the plurality of the power supply channels including the power wiring of the power supply substrate 11, the plurality of the power paths which are formed in the cooler 61 and the power wiring of the package substrate 75. Thereby, without going through the system board 15, power is supplied to the electronic components of the plurality of the types. Therefore, it is possible to exclude the formation of the power layer in the system board 15, and the voltage drop in the power supply to the electronic components of the plurality of the types, is suppressed.

According to Example 3, the power supply channels where the power supply portions 12A to 12D supply the power to the electronic components of the plurality of the types, are different from each other. That is, the power supply portions 12A to 12D may supply the power at the voltage which is suitable for the electronic components of the plurality of the types, by the power supply channels corresponding to the electronic components of the plurality of the types. According to Example 3, by the cooler 61, it is possible to cool the power supply portions 12A to 12D, the memory 72, the semiconductor chip 73, and the I/O portion 74 at the same time. Consequently, since the cooling system that cools the power supply portions 12A to 12D, the memory 72, the semiconductor chip 73, and the I/O portion 74 may be made as a single system, it is possible to simplify the structure of the package mounting structure 1.

Example 4

Figure 9:
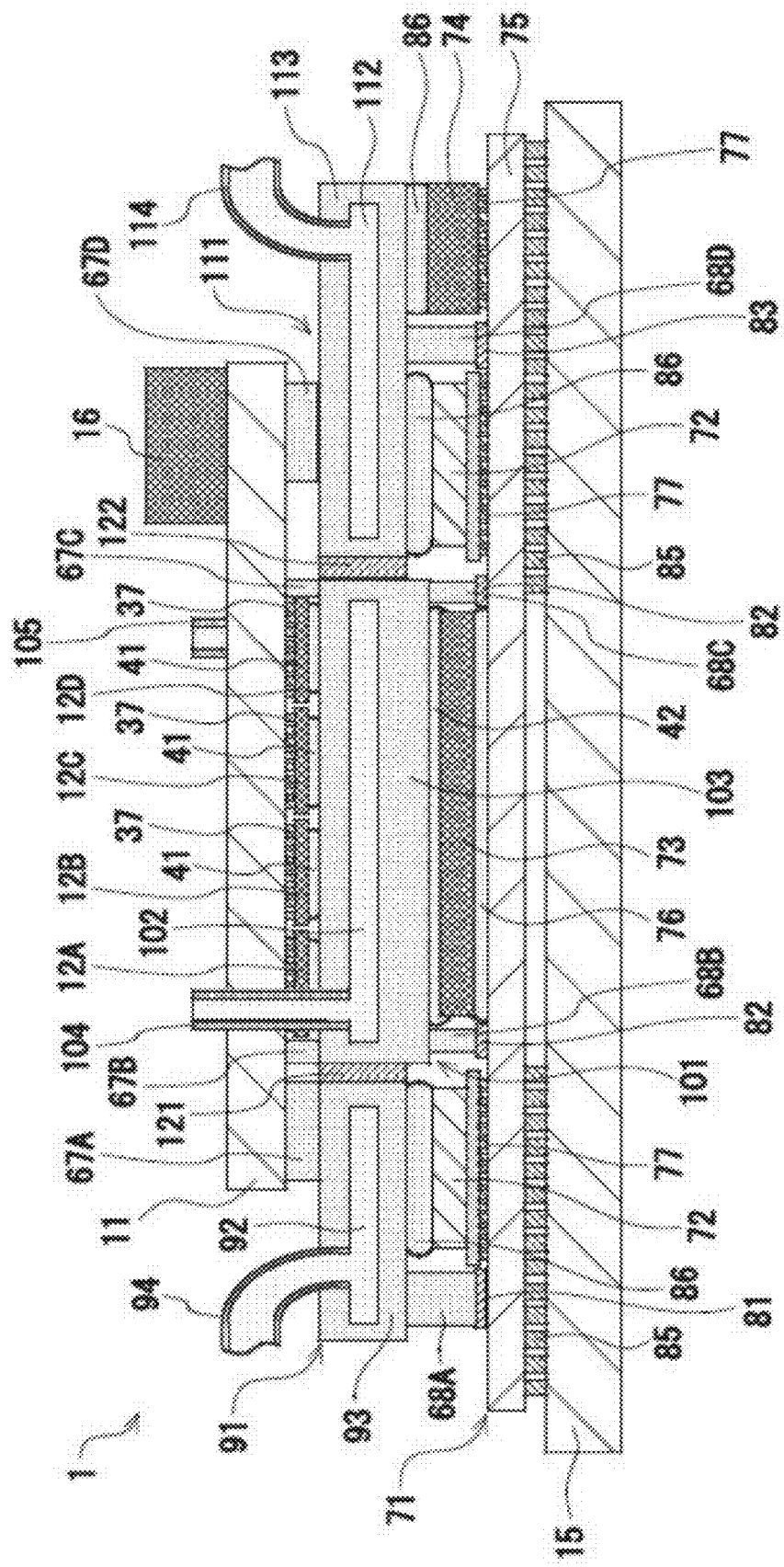
FIG. 9 is a diagram illustrating a package mounting structure according to Example 4.
Figure 10:
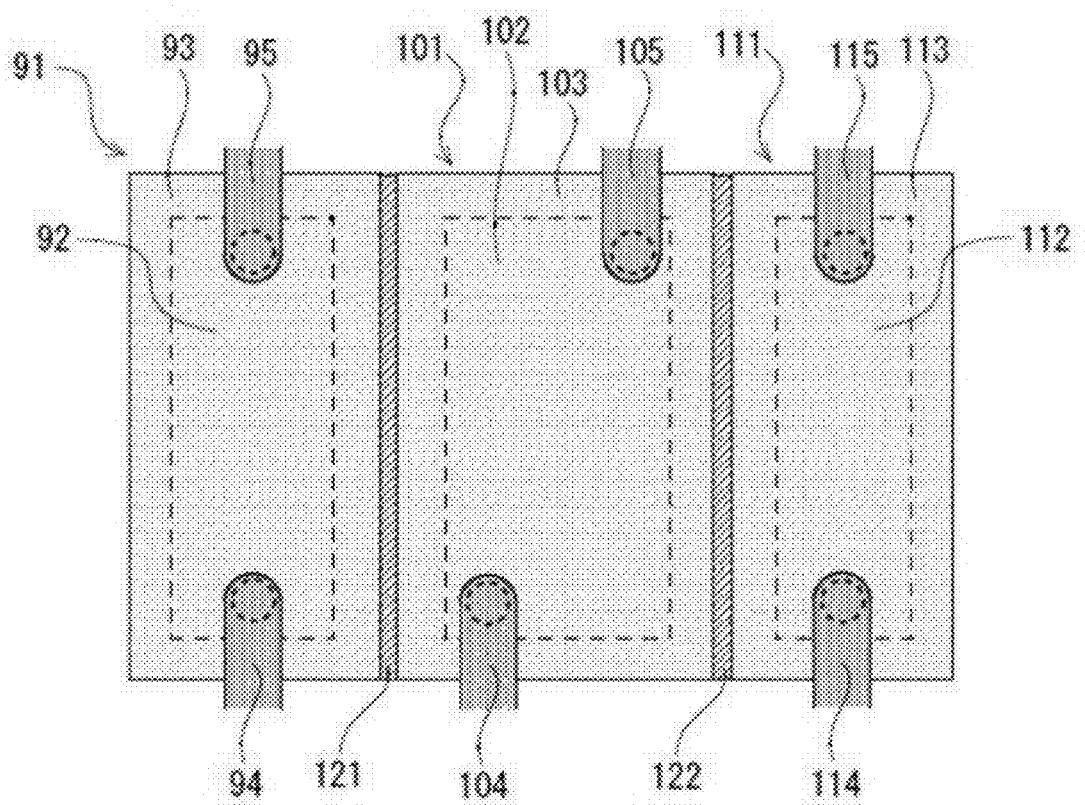
FIG. 10 is a plan view of coolers according to Example 4.

With reference to FIG. 9 and FIG. 10, the package mounting structure 1 according to Example 4 will be described. In the package mounting structure 1 according to Example 4, an example of cooling the electronic components of the plurality of the types by the plurality of the coolers and supplying the power to the electronic components of the plurality of the types, will be described. In Example 4, the same reference numerals as those of Example 1 to Example 3 are attached to the same components as those of Example 1 to Example 3, and the descriptions thereof are excluded.

FIG. 9 is a diagram illustrating the package mounting structure 1 according to Example 4. The package mounting structure 1 according to Example 4 includes the power supply substrate 11, the power supply portions 12A to 12D, a cooler (cooling device) 91, a cooler 101, a cooler 111, the semiconductor package 71, and the system board 15. The coolers 91, 101, and 111 are examples of the cooling unit. The semiconductor package 71 is mounted on the system board 15.

FIG. 10 is a plan view of the coolers 91, 101, and 111 according to Example 4. The coolers 91, 101, and 111 are arranged on the semiconductor package 71. The cooler 91 has a flow path 92 through which the refrigerant flows, and a side wall 93 which surrounds the flow path 92. On the cooler 91, an inlet 94 where the refrigerant flows into the flow path 92, and an outlet 95 where the refrigerant flows out from the flow path 92, are arranged. The pipes (not illustrated) are arranged on the inlet 94 and the outlet 95, and the refrigerant circulates in the flow path 92 through the pipes. The cooler 91 is made of a metal material such as copper having electrical conductivity. The refrigerant which flows through the flow path 92, is the liquid having the insulating properties.

The cooler 101 has a flow path 102 through which the refrigerant flows, and a side wall 103 which surrounds the flow path 102. On the cooler 101, an inlet 104 where the refrigerant flows into the flow path 102, and an outlet 105 where the refrigerant flows out from the flow path 102, are arranged. The pipes (not illustrated) are arranged on the inlet 104 and the outlet 105, and the refrigerant circulates in the flow path 102 through the pipes. The cooler 101 is made of a metal material such as copper having electrical conductivity. The refrigerant which flows through the flow path 102, is the liquid having the insulating properties.

The cooler 111 has a flow path 112 through which the refrigerant flows, and a side wall 113 which surrounds the flow path 112. On the cooler 111, an inlet 114 where the refrigerant flows into the flow path 112, and an outlet 115 where the refrigerant flows out from the flow path 112, are arranged. The pipes (not illustrated) are arranged on the inlet 114 and the outlet 115, and the refrigerant circulates in the flow path 112 through the pipes. The cooler 111 is made of a metal material such as copper having electrical conductivity. The refrigerant which flows through the flow path 112, is the liquid having the insulating properties.

An insulating portion 121 is arranged between the cooler 91 and the cooler 101. Therefore, the cooler 91 and the cooler 101 are electrically divided by the insulating portion 121. An insulating portion 122 is arranged between the cooler 101 and the cooler 111. Thus, the cooler 101 and the cooler 111 are electrically divided by the insulating portion 122. The insulating portions 121 and 122 are made of the resin having the insulating properties, for example, the epoxy resin.

Between the power supply substrate 11 and the cooler 91, a column 67A is arranged on the side wall 93 of the cooler 91. In other words, the column 67A is formed on the upper face of the cooler 91. Between the power supply substrate 11 and the cooler 101, a column 67B and a column 67C are arranged on the side wall 103 of the cooler 101. In other words, the columns 67B and 67C are formed on the upper face of the cooler 101. Between the power supply substrate 11 and the cooler 111, a column 67D is arranged on the side wall 113 of the cooler 111. In other words, the column 67D is formed on the upper face of the cooler 111. The column 67A of the cooler 91, the columns 67B and 67C of the cooler 101, and the column 67D of the cooler 111 are made of a metal material such as copper having electrical conductivity. The cooler 91 is electrically connected to the power wiring of the power supply substrate 11, through the column 67A of the cooler 91. The cooler 101 is electrically connected to the power wiring of the power supply substrate 11, through the columns 67B and 67C of the cooler 101. The cooler 111 is electrically connected to the power wiring of the power supply substrate 11, through the column 67D of the cooler 111.

The power supply substrate 11 is arranged on the coolers 91, 101, and 111. The power supply substrate 11 is placed on the upper faces of the coolers 91, 101, and 111. The power supply portions 12A to 12D are placed on the upper face of the cooler 101, and are joined to the upper face of the cooler 101. The joining member 41 is arranged between the power supply portions 12A to 12D and the cooler 101. The cooler 101 cools the power supply portions 12A to 12D. That is, the heat which is generated in the power supply portions 12A to 12D is transmitted to the cooler 101, through the joining member 41, and thereby the power supply portions 12A to 12D are cooled.

The memory 72 is placed on the lower face of the cooler 91, and is joined to the lower face of the cooler 91. The joining member 86 is arranged between the memory 72 and the cooler 91. The cooler 91 cools the memory 72. That is, the heat which is generated in the memory 72 is transmitted to the cooler 91, through the joining member 86, and thereby the memory 72 is cooled. Furthermore, the memory 72 is placed on the lower face of the cooler 111, and is joined to the lower face of the cooler 111. The joining member 86 is arranged between the memory 72 and the cooler 111. The cooler 111 cools the memory 72. That is, the heat which is generated in the memory 72 is transmitted to the cooler 111, through the joining member 86, and thereby the memory 72 is cooled.

The semiconductor chip 73 is placed on the lower face of the cooler 101, and is joined to the lower face of the cooler 101. That is, the semiconductor chip 73 is joined to the face (lower face) of the cooler 101 different from the face (upper face) to which the power supply portions 12A to 12D are joined. The joining member 42 is arranged between the semiconductor chip 73 and the cooler 101. The cooler 101 cools the semiconductor chip 73. That is, the heat which is generated in the semiconductor chip 73 is transmitted to the cooler 101, through the joining member 42, and thereby the semiconductor chip 73 is cooled.

The I/O portion 74 is placed on the lower face of the cooler 111, and is joined to the lower face of the cooler 111. The joining member 86 is arranged between the I/O portion 74 and the cooler 111. The cooler 111 cools the I/O portion 74. That is, the heat which is generated in the I/O portion 74 is transmitted to the cooler 111, through the joining member 86, and thereby the I/O portion 74 is cooled.

Between the cooler 91 and the package substrate 75, the column 68A is arranged on the side wall 93 of the cooler 91. In other words, the column 68A is arranged on the lower face of the cooler 91. Between the cooler 101 and the package substrate 75, the columns 68B and 68C are arranged on the side wall 103 of the cooler 101. In other words, the columns 68B and 68C are arranged on the lower face of the cooler 101. Between the cooler 111 and the package substrate 75, the column 68D is arranged on the side wall 113 of the cooler 111. In other words, the column 68D is arranged on the lower face of the cooler 111.

The power supply portion 12A is electrically connected to the cooler 91, through the power wiring of the power supply substrate 11 and the column 67A of the cooler 91. The cooler 91 is electrically connected to the memory 72, through the column 68A of the cooler 91, the power pad 81 of the package substrate 75 and the power wiring of the package substrate 75. Therefore, the power supply portion 12A supplies power to the memory 72, through the power wiring of the power supply substrate 11, the cooler 91, and the power wiring of the package substrate 75. More specifically, the power supply portion 12A supplies power to the memory 72, through the power wiring of the power supply substrate 11, the column 67A of the cooler 91, the side wall 93 of the cooler 91, the column 68A of the cooler 91, the power pad 81 of the package substrate 75, and the power wiring of the package substrate 75.

The power supply portion 12B is electrically connected to the cooler 101, through the power wiring of the power supply substrate 11 and the column 67B of the cooler 101. The cooler 101 is electrically connected to the semiconductor chip 73, through the column 68B of the cooler 101, the power pad 82 of the package substrate 75, and the power wiring of the package substrate 75. Therefore, the power supply portion 12B supplies power to the semiconductor chip 73, through the power wiring of the power supply substrate 11, the cooler 101, and the power wiring of the package substrate 75. More specifically, the power supply portion 12B supplies power to the semiconductor chip 73, through the power wiring of the power supply substrate 11, the column 67B of the cooler 101, the side wall 103 of the cooler 101, the column 68B of the cooler 101, the power pad 82 of the package substrate 75, and the power wiring of the package substrate 75.

The power supply portion 12C is electrically connected to the cooler 101, through the power wiring of the power supply substrate 11 and the column 67C of the cooler 101. The cooler 101 is electrically connected to the semiconductor chip 73, through the column 68C of the cooler 101, the power pad 82 of the package substrate 75, and the power wiring of the package substrate 75. Therefore, the power supply portion 12C supplies power to the semiconductor chip 73, through the power wiring of the power supply substrate 11, the cooler 101, and the power wiring of the package substrate 75. More specifically, the power supply portion 12C supplies power to the semiconductor chip 73, through the power wiring of the power supply substrate 11, the column 67C of the cooler 101, the side wall 103 of the cooler 101, the column 68C of the cooler 101, the power pad 82 of the package substrate 75, and the power wiring of the package substrate 75.

The power supply portion 12D is electrically connected to the cooler 111, through the power wiring of the power supply substrate 11 and the column 67D of the cooler 111. The cooler 111 is electrically connected to the I/O portion 74, through the column 68D of the cooler 111, the power pad 83 of the package substrate 75, and the power wiring of the package substrate 75. Therefore, the power supply portion 12D supplies power to the I/O portion 74, through the power wiring of the power supply substrate 11, the cooler 111 and the power wiring of the package substrate 75. More specifically, the power supply portion 12D supplies power to the I/O portion 74, through the power wiring of the power supply substrate 11, the column 67D of the cooler 111, the side wall 113 of the cooler 111, the column 68D of the cooler 111, the power pad 83 of the package substrate 75, and the power wiring of the package substrate 75.

In Example 4, the power supply portions 12A to 12D supply the power to the electronic components of the plurality of the types, through the power wiring of the power supply substrate 11, the coolers 91, 101, and 111, and the power wiring of the package substrate 75. Thereby, without going through the system board 15, power is supplied to the electronic components of the plurality of the types. Therefore, it is possible to exclude the formation of the power layer in the system board 15, and the voltage drop in the power supply to the electronic components of the plurality of the types, is suppressed.

According to Example 4, the power supply channels where the power supply portions 12A to 12D supply the power to the electronic components of the plurality of the types, are different from each other. That is, the power supply portions 12A to 12D may supply the power at the voltage which is suitable for the electronic components of the plurality of the types, by the power supply channels corresponding to the electronic components of the plurality of the types. According to Example 4, the cooler 91 cools the memory 72, the cooler 101 cools the semiconductor chip 73, and the cooler 111 cools the memory 72 and the I/O portion 74. Therefore, temperature control of the memory 72, the semiconductor chip 73 and the I/O portion 74 is easy.

Example 5

Figure 11:
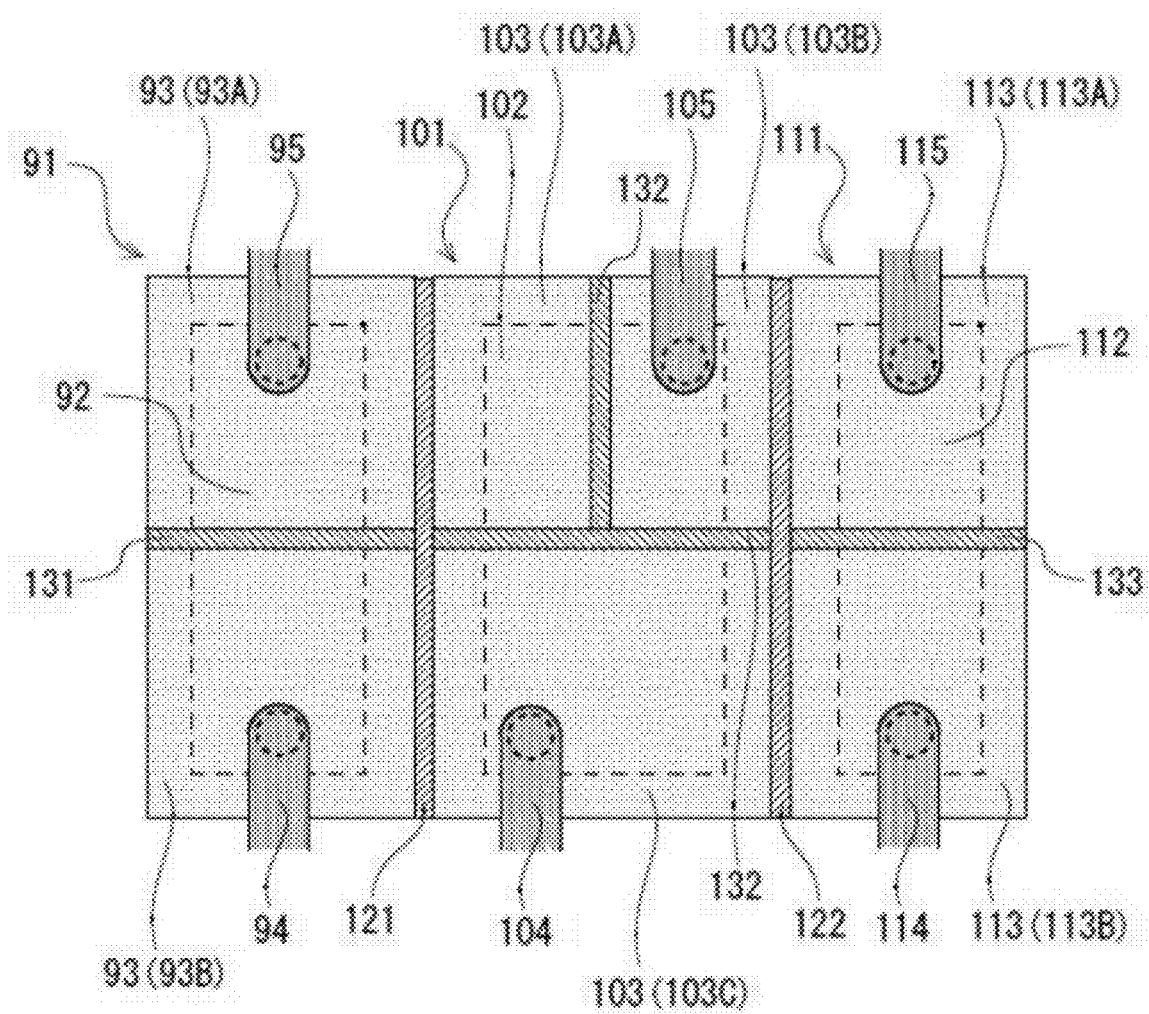
FIG. 11 is a plan view of coolers according to Example 5.

With reference to FIG. 11, the package mounting structure 1 according to Example 5 will be described. In comparison with Example 4, Example 5 has the different point that the side wall 93 of the cooler (cooling device) 91, the side wall 103 of the cooler 101, and the side wall 113 of the cooler 111 are electrically divided by insulating portions 131 to 133. In Example 5, the same reference numerals as those of Example 1 to Example 4 are attached to the same components as those of Example 1 to Example 4, and the descriptions thereof are excluded.

FIG. 11 is a plan view of the coolers 91, 101, and 111 according to Example 5. The side wall 93 of the cooler 91 is electrically divided by the insulating portion 131. The side wall 103 of the cooler 101 is electrically divided by the insulating portion 132. The side wall 113 of the cooler 111 is electrically divided by the insulating portion 133. The insulating portions 131, 132, and 133 are made of the resin having the insulating properties, for example, the epoxy resin.

In the package mounting structure 1 according to Example 5, between the power supply substrate 11 and the cooler 91, the column 67A may be arranged on side walls 93A and 93B of the cooler 91, respectively. Furthermore, between the cooler 91 and the package substrate 75, the column 68A may be arranged on the side walls 93A and 93B of the cooler 91, respectively. Thereby, the power supply portion 12A may supply the power to the memory 72, through the power wiring of the power supply substrate 11, the columns 67A and 68A of the cooler 91, the side walls 93A and 93B of the cooler 91, the power pad 81 of the package substrate 75, and the power wiring of the package substrate 75. In this case, the power supply portion 12A may use the power supply channel including the side wall 93A of the cooler 91, as a ground line, and may use the power supply channel including the side wall 93B of the cooler 91, as a power line.

In the package mounting structure 1 according to Example 5, between the power supply substrate 11 and the cooler 101, the column 67B or the column 67C may be arranged on side walls 103A, 103B, and 103C of the cooler 101, respectively. Furthermore, between the cooler 101 and the package substrate 75, the column 68B or the column 68C may be arranged on the side walls 103A, 103B, and 103C of the cooler 101, respectively. Thereby, the power supply portion 12B may supply the power to the semiconductor chip 73, through the power wiring of the power supply substrate 11, the columns 67B and 68B of the cooler 101, the side walls 103A, 103B, and 103C of the cooler 101, the power pad 82 of the package substrate 75, and the power wiring of the package substrate 75. Moreover, the power supply portion 12C may supply the power to the memory 72, through the power wiring of the power supply substrate 11, the columns 67C and 68C of the cooler 101, the side walls 103A, 103B, and 103C of the cooler 101, the power pad 82 of the package substrate 75, and the power wiring of the package substrate 75. In this case, the power supply portion 12B may use the power supply channel including the side wall 103A of the cooler 101 and the power supply channel including the side wall 103B of the cooler 101, as a power line, and may use the power supply channel including the side wall 103C of the cooler 101, as a ground line.

In the package mounting structure 1 according to Example 5, between the power supply substrate 11 and the cooler 111, the column 67D may be arranged on side walls 113A and 113B of the cooler 111, respectively. Furthermore, between the cooler 111 and the package substrate 75, the column 68D may be arranged on the side walls 113A and 113B of the cooler 111, respectively. Thereby, the power supply portion 12D may supply the power to the I/O portion 74, through the power wiring of the power supply substrate 11, the columns 67D and 68D of the cooler 111, the side walls 113A and 113B of the cooler 111, the power pad 83 of the package substrate 75, and the power wiring of the package substrate 75. In this case, the power supply portion 12D may use the power supply channel including the side wall 113A of the cooler 111, as a ground line, and may use the power supply channel including the side wall 113B of the cooler 111, as a power line.

The side wall 93 of the cooler 91 is electrically divided by the insulating portion 131, and thereby the plurality of the power paths is formed in the cooler 91. Thus, the plurality of the power supply channels is formed with respect to the memory 72. The side wall 103 of the cooler 101 is electrically divided by the insulating portion 132, and thereby the plurality of the power paths is formed in the cooler 101. Accordingly, the plurality of the power supply channels is formed with respect to the semiconductor chip 73. The side wall 113 of the cooler 111 is electrically divided by the insulating portion 133, and thereby the plurality of the power paths is formed in the cooler 111. Thus, the plurality of the power supply channels is formed with respect to the I/O portion 74.

In Example 5, the power supply portions 12A to 12D supply the power to the electronic components of the plurality of the types, through the power wiring of the power supply substrate 11, the coolers 91, 101, and 111, and the power wiring of the package substrate 75. Thereby, without going through the system board 15, power is supplied to the electronic components of the plurality of the types. Therefore, it is possible to exclude the formation of the power layer in the system board 15, and the voltage drop in the power supply to the electronic components of the plurality of the types, is suppressed.

According to Example 5, the power supply channels where the power supply portions 12A to 12D supply the power to the electronic components of the plurality of the types, are different from each other. That is, the power supply portions 12A to 12D may supply the power at the voltage which is suitable for the electronic components of the plurality of the types, by the power supply channels corresponding to the electronic components of the plurality of the types. According to Example 5, the cooler 91 cools the memory 72, the cooler 101 cools the semiconductor chip 73, and the cooler 111 cools the memory 72 and the I/O portion 74. Therefore, the temperature control of the memory 72, the semiconductor chip 73 and the I/O portion 74 is easy.

Example 6

Figure 12:
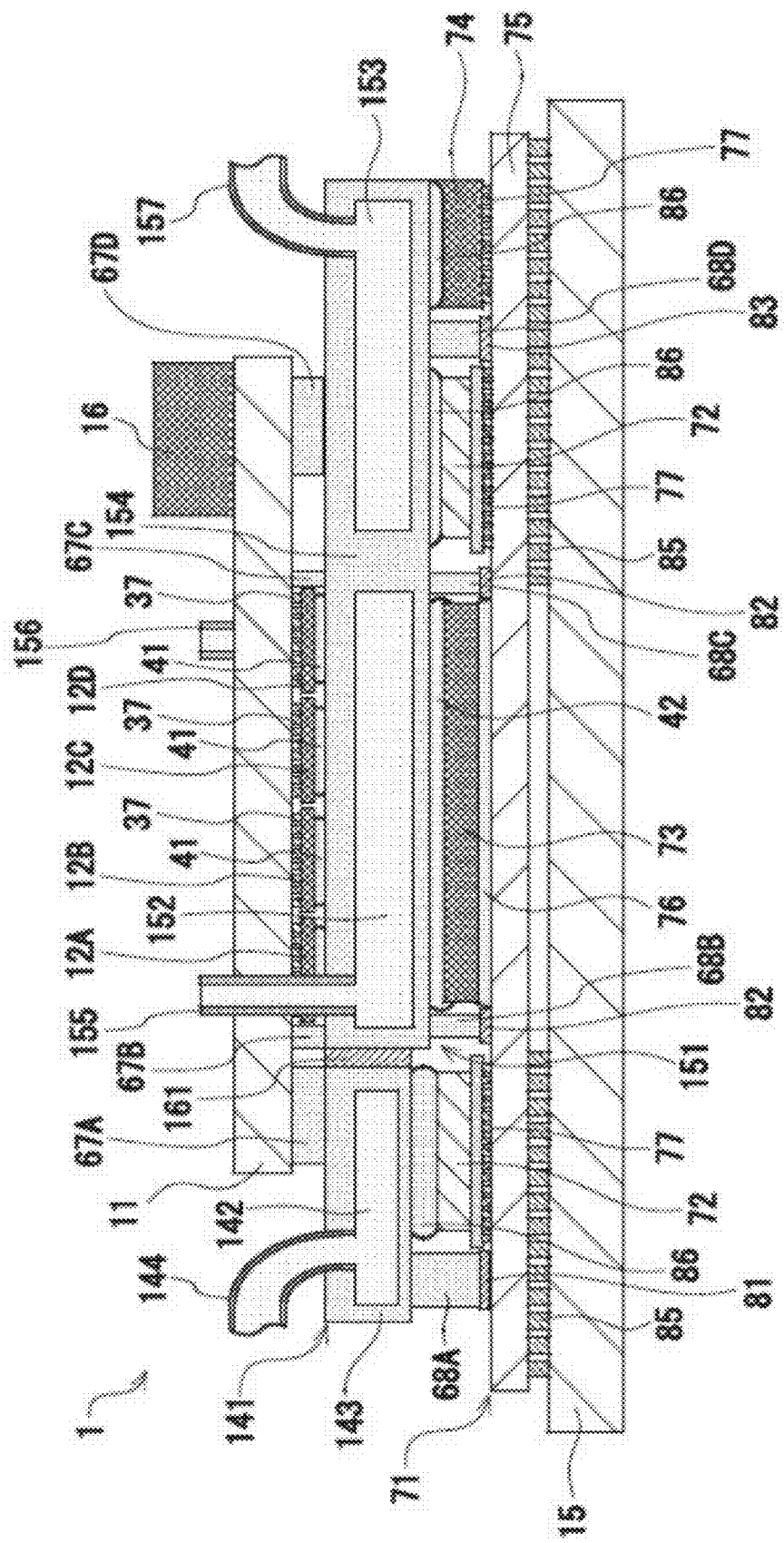
FIG. 12 is a diagram illustrating a package mounting structure according to Example 6.
Figure 13:
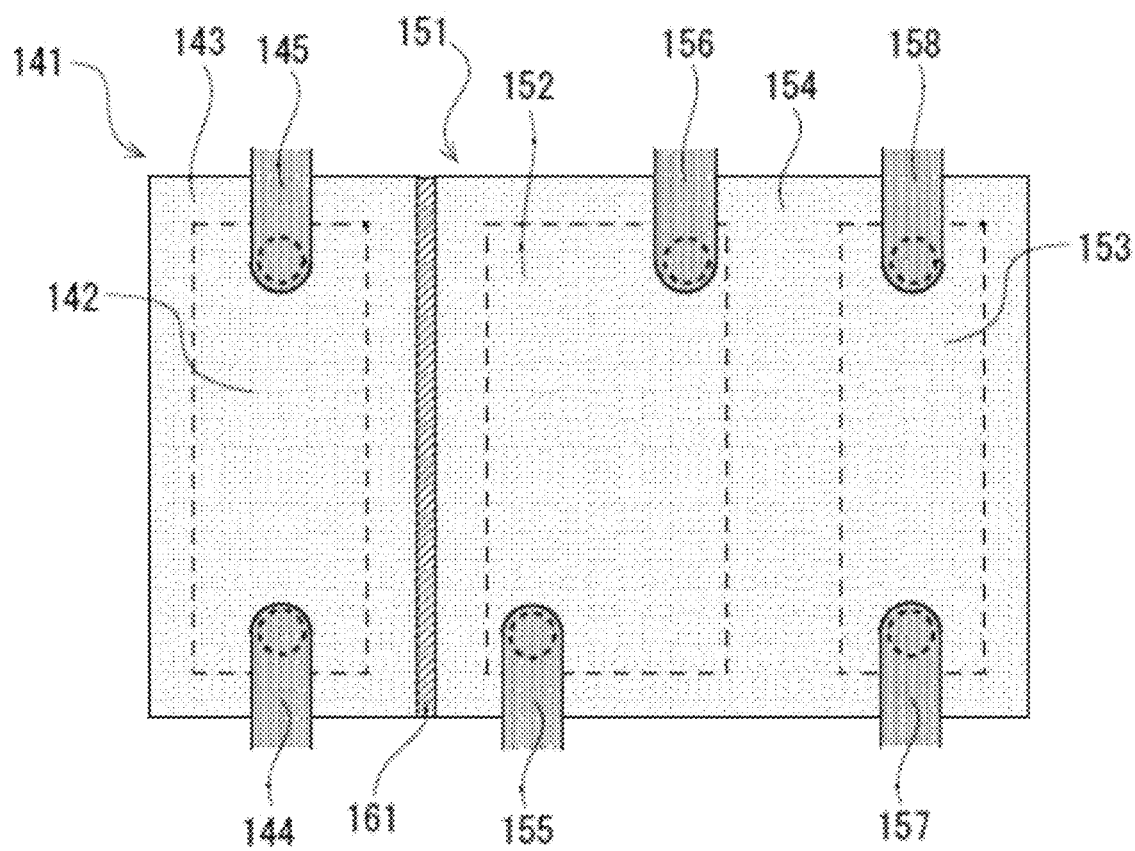
FIG. 13 is a plan view of coolers according to Example 6.

With reference to FIG. 12 and FIG. 13, the package mounting structure 1 according to Example 6 will be described. In the package mounting structure 1 according to Example 6, an example of cooling the electronic components of the plurality of the types by the plurality of the coolers and supplying the power to the electronic components of the plurality of the types, will be described. Furthermore, in Example 6, the same reference numerals as those of Example 1 to Example 5 are attached to the same components as those of Example 1 to Example 5, and the descriptions thereof are excluded.

FIG. 12 is a diagram illustrating the package mounting structure 1 according to Example 6. The package mounting structure 1 according to Example 6 includes the power supply substrate 11, the power supply portions 12A to 12D, a cooler (cooling device) 141, a cooler 151, the semiconductor package 71, and the system board 15. The coolers 141 and 151 are examples of the cooling unit. The semiconductor package 71 is mounted on the system board 15.

FIG. 13 is a plan view of the cooler 141 and the cooler 151 according to Example 6. The coolers 141 and 151 are arranged on the semiconductor package 71. The cooler 141 has a flow path 142 through which the refrigerant flows, and a side wall 143 which surrounds the flow path 142. On the cooler 141, an inlet 144 where the refrigerant flows into the flow path 142, and an outlet 145 where the refrigerant flows out from the flow path 142 are arranged. The pipes (not illustrated) are arranged on the inlet 144 and the outlet 145, and the refrigerant circulates in the flow path 142 through the pipes. The cooler 141 is made of a metal material such as copper having electrical conductivity. The refrigerant which flows through the flow path 142, is the liquid having the insulating properties.

The cooler 151 has a flow path 152 through which the refrigerant flows, a flow path 153 through which the refrigerant flows, and a side wall 154 which surrounds the flow paths 152 and 153. On the cooler 151, an inlet 155 where the refrigerant flows into the flow path 152, and an outlet 156 where the refrigerant flows out from the flow path 152 are arranged. On the cooler 151, an inlet 157 where the refrigerant flows into the flow path 153, and an outlet 158 where the refrigerant flows out from the flow path 153 are arranged. The pipes (not illustrated) are arranged on the inlet 155 and the outlet 156, and the refrigerant circulates in the flow path 152 through the pipes. The pipes (not illustrated) are arranged on the inlet 157 and the outlet 158, and the refrigerant circulates in the flow path 153 through the pipes. The cooler 151 is made of a metal material such as copper having electrical conductivity. The refrigerant which flows through the flow paths 152 and 153, is the liquid having the insulating properties.

An insulating portion 161 is arranged between the cooler 141 and the cooler 151. Accordingly, the coolers 141 and 151 are electrically divided by the insulating portion 161. The insulating portion 161 is made of the resin having the insulating properties, for example, the epoxy resin.

Between the power supply substrate 11 and the cooler 141, the column 67A is arranged on the side wall 143 of the cooler 141. In other words, the column 67A is formed on the upper face of the cooler 141. Between the power supply substrate 11 and the cooler 151, the columns 67B, 67C, and 67D are arranged on the side wall 154 of the cooler 151. In other words, the columns 67B, 67C, and 67D are formed on the upper face of the cooler 151. The column 67A of the cooler 141 and the columns 67B, 67C, and 67D of the cooler 151 are made of a material metal such as copper having electrical conductivity. The cooler 141 is electrically connected to the power wiring of the power supply substrate 11, through the column 67A of the cooler 141. The cooler 151 is electrically connected to the power wiring of the power supply substrate 11, through the columns 67B, 67C, and 67D of the cooler 151.

The power supply substrate 11 is arranged on the coolers 141 and 151. The power supply substrate 11 is placed on the upper faces of the coolers 141 and 151. The power supply portions 12A to 12D are arranged on the cooler 151. The power supply portions 12A to 12D are placed on the upper face of the cooler 151, and are joined to the upper face of the cooler 151. The joining member 41 is arranged between the power supply portions 12A to 12D and the cooler 151. The cooler 151 cools the power supply portions 12A to 12D. That is, the heat which is generated in the power supply portions 12A to 12D is transmitted to the cooler 151, through the joining member 41, and thereby the power supply portions 12A to 12D are cooled.

The memory 72 is placed on the lower face of the cooler 141, and is joined to the lower face of the cooler 141. The joining member 86 is arranged between the memory 72 and the cooler 141. The cooler 141 cools the memory 72. That is, the heat which is generated in the memory 72 is transmitted to the cooler 141, through the joining member 86, and thereby the memory 72 is cooled. Furthermore, the memory 72 is placed on the lower face of the cooler 151, and is joined to the lower face of the cooler 151. The joining member 86 is arranged between the memory 72 and the cooler 151. The cooler 151 cools the memory 72. That is, the heat which is generated in the memory 72 is transmitted to the cooler 151, through the joining member 86, and thereby the memory 72 is cooled.

The semiconductor chip 73 is placed on the lower face of the cooler 151, and is joined to the lower face of the cooler 151. That is, the semiconductor chip 73 is joined to the face (lower face) of the cooler 151 different from the face (upper face) to which the power supply portions 12A to 12D are joined. The joining member 42 is arranged between the semiconductor chip 73 and the cooler 151. The cooler 151 cools the semiconductor chip 73. That is, the heat which is generated in the semiconductor chip 73 is transmitted to the cooler 151, through the joining member 42, and thereby the semiconductor chip 73 is cooled.

The I/O portion 74 is placed on the lower face of the cooler 151, and is joined to the lower face of the cooler 151. That is, the I/O portion 74 is joined to the face (lower face) of the cooler 151 different from the face (upper face) to which the power supply portions 12A to 12D are joined. The joining member 86 is arranged between the I/O portion 74 and the cooler 151. The cooler 151 cools the I/O portion 74. That is, the heat which is generated in the I/O portion 74 is transmitted to the cooler 151, through the joining member 86, and thereby the I/O portion 74 is cooled.

Between the cooler 141 and the package substrate 75, the column 68A is arranged on the side wall 143 of the cooler 141. In other words, the column 68A is arranged on the lower face of the cooler 141. Between the cooler 151 and the package substrate 75, the columns 68B, 68C, and 68D are arranged on the side wall 154 of the cooler 151. In other words, the columns 68B, 68C, and 68D are arranged on the lower face of the cooler 151.

The power supply portion 12A is electrically connected to the cooler 141, through the power wiring of the power supply substrate 11 and the column 67A of the cooler 141. The cooler 141 is electrically connected to the memory 72, through the column 68A of the cooler 141, the power pad 81 of the package substrate 75 and the power wiring of the package substrate 75. Therefore, the power supply portion 12A supplies power to the memory 72, through the power wiring of the power supply substrate 11, the cooler 141, and the power wiring of the package substrate 75. More specifically, the power supply portion 12A supplies power to the memory 72, through the power wiring of the power supply substrate 11, the column 67A of the cooler 141, the side wall 143 of the cooler 141, the column 68A of the cooler 141, the power pad 81 of the package substrate 75, and the power wiring of the package substrate 75.

The power supply portion 12B is electrically connected to the cooler 151, through the power wiring of the power supply substrate 11 and the column 67B of the cooler 151. The cooler 151 is electrically connected to the semiconductor chip 73, through the column 68B of the cooler 151, the power pad 82 of the package substrate 75 and the power wiring of the package substrate 75. Therefore, the power supply portion 12B supplies power to the semiconductor chip 73, through the power wiring of the power supply substrate 11, the cooler 151, and the power wiring of the package substrate 75. More specifically, the power supply portion 12B supplies power to the semiconductor chip 73, through the power wiring of the power supply substrate 11, the column 67B of the cooler 151, the side wall 154 of the cooler 151, the column 68B of the cooler 151, the power pad 82 of the package substrate 75, and the power wiring of the package substrate 75.

The power supply portion 12C is electrically connected to the cooler 151, through the power wiring of the power supply substrate 11 and the column 67C of the cooler 151. The cooler 151 is electrically connected to the semiconductor chip 73, through the column 68C of the cooler 151, the power pad 82 of the package substrate 75, and the power wiring of the package substrate 75. Therefore, the power supply portion 12C supplies power to the semiconductor chip 73, through the power wiring of the power supply substrate 11, the cooler 151, and the power wiring of the package substrate 75. More specifically, the power supply portion 12C supplies power to the semiconductor chip 73, through the power wiring of the power supply substrate 11, the column 67C of the cooler 151, the side wall 154 of the cooler 151, the column 68C of the cooler 151, the power pad 82 of the package substrate 75, and the power wiring of the package substrate 75.

The power supply portion 12D is electrically connected to the cooler 151, through the power wiring of the power supply substrate 11 and the column 67D of the cooler 151. The cooler 151 is electrically connected to the I/O portion 74, through the column 68D of the cooler 151, the power pad 83 of the package substrate 75 and the power wiring of the package substrate 75. Therefore, the power supply portion 12D supplies power to the I/O portion 74, through the power wiring of the power supply substrate 11, the cooler 151, and the power wiring of the package substrate 75. More specifically, the power supply portion 12D supplies power to the I/O portion 74, through the power wiring of the power supply substrate 11, the column 67D of the cooler 151, the side wall 154 of the cooler 151, the column 68D of the cooler 151, the power pad 83 of the package substrate 75, and the power wiring of the package substrate 75.

According to Example 6, the power supply portion 12A supplies power to the memory 72, through the power supply channel including the power wiring of the power supply substrate 11, the cooler 141, and the power wiring of the package substrate 75. The power supply portions 12B and 12C supply the power to the semiconductor chip 73, through the power supply channel including the power wiring of the power supply substrate 11, the cooler 151, and the power wiring of the package substrate 75. The power supply portion 12D supplies power to the I/O portion 74, through the power supply channel including the power wiring of the power supply substrate 11, the cooler 151, and the power wiring of the package substrate 75. Thereby, without going through the system board 15, power is supplied to the electronic components of the plurality of the types. Therefore, it is possible to exclude the formation of the power layer in the system board 15, and the voltage drop in the power supply to the electronic components of the plurality of the types, is suppressed.

The memory 72 is cooled by the cooler 141, the semiconductor chip 73 is cooled by the flow path 152 of the cooler 151, and the memory 72 and the I/O portion 74 are cooled by the flow path 153 of the cooler 151. Therefore, the temperature control of the memory 72, the semiconductor chip 73, and the I/O portion 74 is easy. The voltage value of the power supply is the same value with respect to the semiconductor chip 73 and the I/O portion 74. Accordingly, it is possible to supply power at the same potential, with respect to the electronic components of the plurality of the types, and it is possible to perform the cooling corresponding to the electronic components of the plurality of the types having different calorific power.

Example 7

Figure 14:
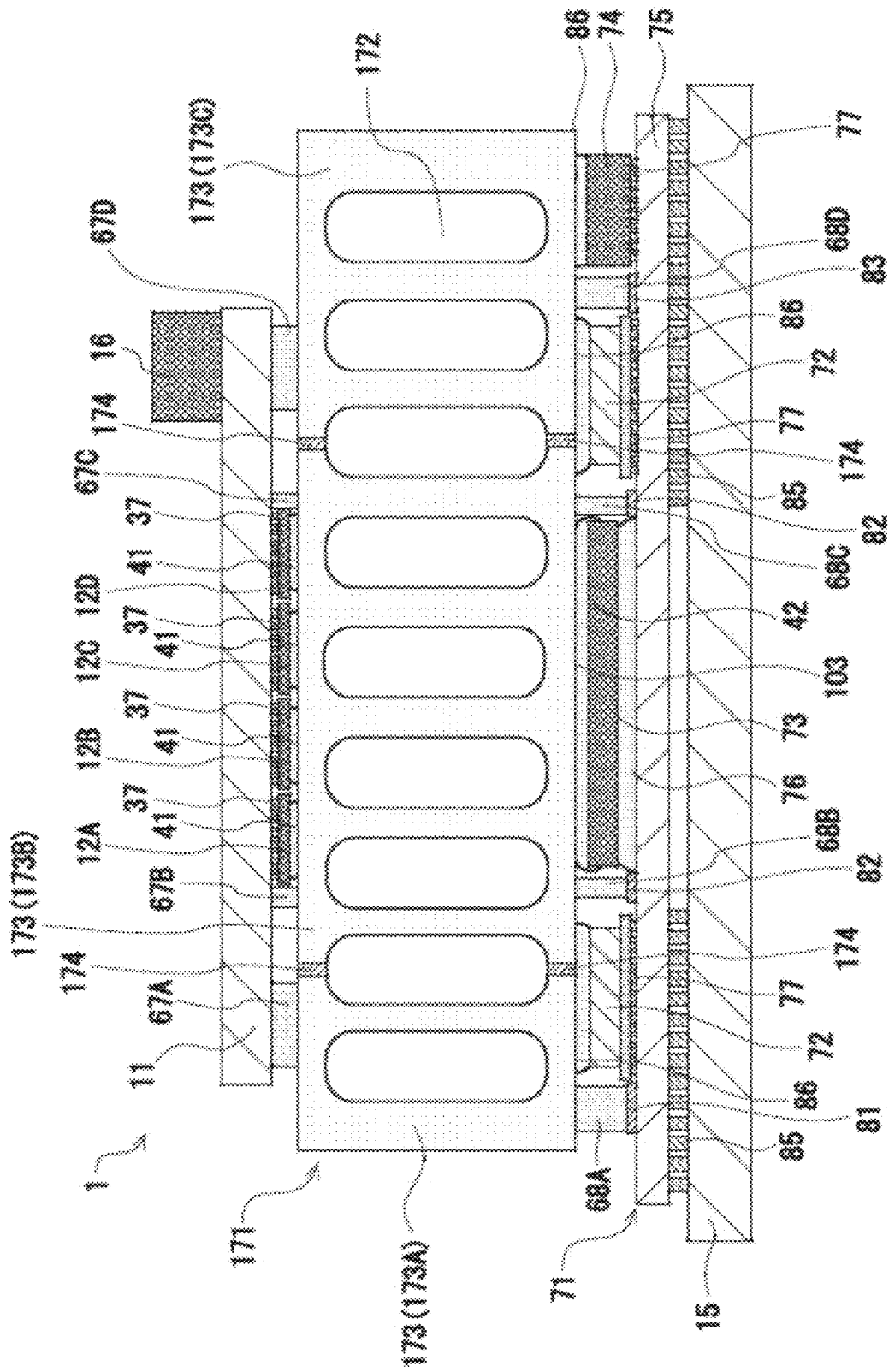
FIG. 14 is a diagram illustrating a package mounting structure according to Example 7.

With reference to FIG. 14, the package mounting structure 1 according to Example 7 will be described. In Example 1 to Example 6, examples of cooling the package mounting structure by liquid cooling, are illustrated. In the package mounting structure 1 according to Example 7, an example of cooling the electronic components of the plurality of the types by air cooling, will be described. Furthermore, in Example 7, the same reference numerals as those of Example 1 to Example 6 are attached to the same components as those of Example 1 to Example 6, and the descriptions thereof are excluded.

FIG. 14 is a diagram illustrating the package mounting structure 1 according to Example 7. The package mounting structure 1 according to Example 7 includes the power supply substrate 11, the power supply portions 12A to 12D, a cooler (cooling device) 171, the semiconductor package 71, and the system board 15. The cooler 171 is an example of the cooling unit. The semiconductor package 71 is mounted on the system board 15.

The cooler 171 is arranged on the semiconductor package 71. The cooler 171 has an air flow path 172 through which air supplied from an air supplier (not illustrated) flows, and a side wall 173 (173A, 173B, and 173C) which surrounds the air flow path 172. The cooler 171 is made of a metal material such as copper having electrical conductivity. The side wall 173 of the cooler 171 is electrically divided by an insulating portion 174. The insulating portion 174 is made of the resin having the insulating properties, for example, the epoxy resin.

The power supply substrate 11 and the power supply portions 12A to 12D are arranged on the cooler 171. The power supply substrate 11 is placed on the upper face of the cooler 171. Between the power supply substrate 11 and the cooler 171, the column 67A is arranged on the side wall 173A of the cooler 171, the columns 67B and 67C are arranged on the side wall 173B of the cooler 171, and the column 67D is arranged on the side wall 173C of the cooler 171. In other words, the columns 67A to 67D are formed on the upper face of the cooler 171. The columns 67A to 67D of the cooler 171 are made of a metal material such as copper having electrical conductivity. The cooler 171 is electrically connected to the power wiring of the power supply substrate 11, through the columns 67A to 67D of the cooler 171.

The power supply portions 12A to 12D are placed on the upper face of the cooler 171, and are joined to the upper face of the cooler 171. The joining member 41 is arranged between the power supply portions 12A to 12D and the cooler 171. The cooler 171 cools the power supply portions 12A to 12D. That is, the heat which is generated in the power supply portions 12A to 12D is transmitted to the cooler 171, through the joining member 41, and thereby the power supply portions 12A to 12D are cooled.

The semiconductor chip 73 is placed on the lower face of the cooler 171, and is joined to the lower face of the cooler 171. That is, the semiconductor chip 73 is joined to the face (lower face) of the cooler 171 different from the face (upper face) to which the power supply portions 12A to 12D are joined. The joining member 42 is arranged between the cooler 171 and the semiconductor chip 73. The cooler 171 cools the semiconductor chip 73. That is, the heat which is generated in the semiconductor chip 73 is transmitted to the cooler 171, through the joining member 42, and thereby the semiconductor chip 73 is cooled.

The memory 72 and the I/O portion 74 are placed on the lower face of the cooler 171, and are joined to the lower face of the cooler 171. That is, the memory 72 and the I/O portion 74 are joined to the face (lower face) of the cooler 171 different from the face (upper face) to which the power supply portions 12A to 12D are joined. The joining member 86 is arranged between the cooler 171 and the memory 72 and the I/O portion 74. The cooler 171 cools the memory 72 and the I/O portion 74. That is, the heat which is generated in the memory 72 and the I/O portion 74 is transmitted to the cooler 171, through the joining member 86, and thereby the memory 72 and the I/O portion 74 are cooled.

Between the cooler 171 and the package substrate 75, the column 68A is arranged on the side wall 173A of the cooler 171, the columns 68B and 68C are arranged on the side wall 173B of the cooler 171, and the column 68D is arranged on the side wall 173C of the cooler 171. In other words, the columns 68A to 68D are formed on the lower face of the cooler 171. The columns 68A to 68D of the cooler 171 are made of a metal material such as copper having electrical conductivity. The columns 68A to 68D of the cooler 171 are connected to the power pads 81 to 83 of the package substrate 75, by soldering. The cooler 171 is electrically connected to the power wiring of the package substrate 75, through the columns 68A to 68D of the cooler 171 and the power pads 81 to 83 of the package substrate 75.

The power supply portion 12A is electrically connected to the cooler 171, through the power wiring of the power supply substrate 11 and the column 67A of the cooler 171. The cooler 171 is electrically connected to the memory 72, through the column 68A of the cooler 171, the power pad 81 of the package substrate 75, and the power wiring of the package substrate 75. Thus, the power supply portion 12A supplies power to the memory 72, through the power wiring of the power supply substrate 11, the cooler 171, and the power wiring of the package substrate 75. More specifically, the power supply portion 12A supplies power to the memory 72, through the power wiring of the power supply substrate 11, the column 67A of the cooler 171, the side wall 173A of the cooler 171, the column 68A of the cooler 171, the power pad 81 of the package substrate 75, and the power wiring of the package substrate 75.

The power supply portion 12B is electrically connected to the cooler 171, through the power wiring of the power supply substrate 11 and the column 67B of the cooler 171. The cooler 171 is electrically connected to the semiconductor chip 73, through the column 68B of the cooler 171, the power pad 82 of the package substrate 75, and the power wiring of the package substrate 75. Accordingly, the power supply portion 12B supplies power to the semiconductor chip 73, through the power wiring of the power supply substrate 11, the cooler 171, and the power wiring of the package substrate 75. More specifically, the power supply portion 12B supplies power to the semiconductor chip 73, through the power wiring of the power supply substrate 11, the column 67B of the cooler 171, the side wall 173B of the cooler 171, the column 68B of the cooler 171, the power pad 82 of the package substrate 75, and the power wiring of the package substrate 75.

The power supply portion 12C is electrically connected to the cooler 171, through the power wiring of the power supply substrate 11 and the column 67C of the cooler 171. The cooler 171 is electrically connected to the semiconductor chip 73, through the column 68C of the cooler 171, the power pad 82 of the package substrate 75, and the power wiring of the package substrate 75. Therefore, the power supply portion 12C supplies power to the semiconductor chip 73, through the power wiring of the power supply substrate 11, the cooler 171, and the power wiring of the package substrate 75. More specifically, the power supply portion 12C supplies power to the semiconductor chip 73, through the power wiring of the power supply substrate 11, the column 67C of the cooler 171, the side wall 173B of the cooler 171, the column 68C of the cooler 171, the power pad 82 of the package substrate 75, and the power wiring of the package substrate 75.

The power supply portion 12D is electrically connected to the cooler 171, through the power wiring of the power supply substrate 11 and the column 67D of the cooler 171. The cooler 171 is electrically connected to the I/O portion 74, through the column 68D of the cooler 171, the power pad 83 of the package substrate 75, and the power wiring of the package substrate 75. Accordingly, the power supply portion 12D supplies power to the I/O portion 74, through the power wiring of the power supply substrate 11, the cooler 171, and the power wiring of the package substrate 75. More specifically, the power supply portion 12D supplies power to the I/O portion 74, through the power wiring of the power supply substrate 11, the column 67D of the cooler 171, the side wall 173C of the cooler 171, the column 68D of the cooler 171, the power pad 83 of the package substrate 75, and the power wiring of the package substrate 75.

In Example 7, the side wall 173 of the cooler 171 is electrically divided by the insulating portion 174, and thereby the plurality of the power paths is formed in the cooler 171. Accordingly, the plurality of the power supply channels is formed with respect to the electronic components of the plurality of the types. That is, the power supply channel where the power supply portion 12A supplies power to the memory 72, the power supply channel where the power supply portions 12B and 12C supply the power to the semiconductor chip 73, and the power supply channel where the power supply portion 12D supplies power to the I/O portion 74, are formed. Therefore, the power supply portions 12A to 12D supply the power to the electronic components of the plurality of the types, through the plurality of the power supply channels including the power wiring of the power supply substrate 11, the plurality of the power paths which are formed in the cooler 171 and the power wiring of the package substrate 75. Thereby, without going through the system board 15, power is supplied to the electronic components of the plurality of the types. Therefore, it is possible to exclude the formation of the power layer in the system board 15, and the voltage drop in the power supply to the electronic components of the plurality of the types, is suppressed.

According to Example 7, the power supply channels where the power supply portions 12A to 12D supply the power to the electronic components of the plurality of the types, are different from each other. That is, the power supply portions 12A to 12D may supply the power at the voltage which is suitable for the electronic components of the plurality of the types, by the power supply channels corresponding to the electronic components of the plurality of the types. According to Example 7, by the air cooling type cooler 171, it is possible to cool the power supply portions 12A to 12D, the memory 72, the semiconductor chip 73, and the I/O portion 74 at the same time. Consequently, since the cooling system that cools the power supply portions 12A to 12D, the memory 72, the semiconductor chip 73, and the I/O portion 74 may be made as a single system, it is possible to simplify the structure of the package mounting structure 1. In Example 7, an example of electrically dividing the side wall 173 of the cooler 171 into the side walls 173A, 1736, and 173C of the cooler 171 by the insulating portion 174, is illustrated, but the side wall 173 of the cooler 171 may not be electrically divided, as Example 1.

Modification 1

Figure 15:
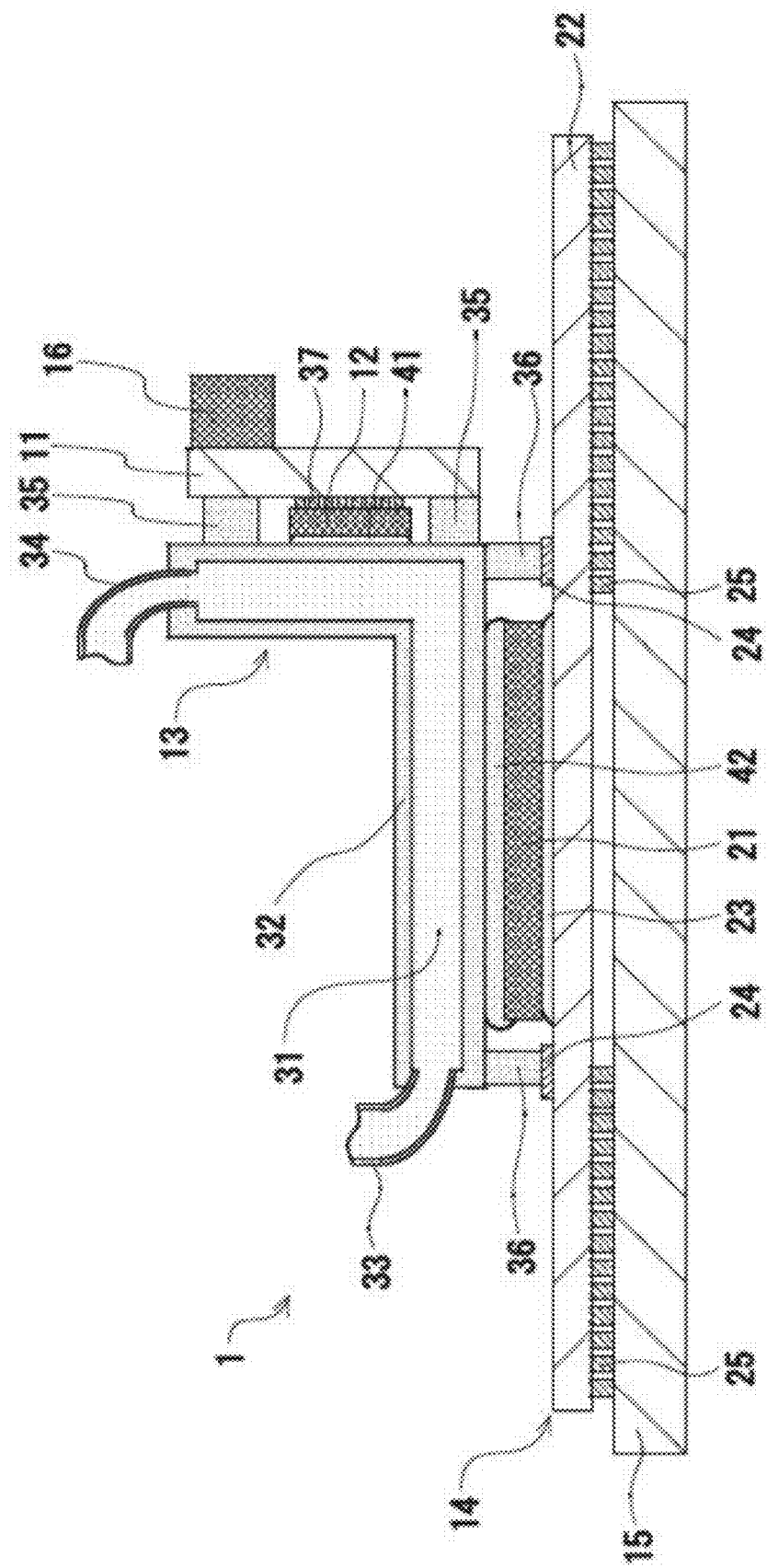
FIG. 15 is a diagram illustrating a package mounting structure according to Modification 1.

In Example 1, an example of placing the power supply portion 12 on the upper face of the cooler 13 and joining the power supply portion 12 to the upper face of the cooler 13, is illustrated. Not limited to the example, as illustrated in FIG. 15, the power supply portion 12 may be placed on a side face of the cooler 13, and be joined to the side face of the cooler 13. The side face is an example of the first face. FIG. 15 is a diagram illustrating the package mounting structure 1 according to Modification 1. In the example which is illustrated in FIG. 15, the power supply substrate 11 is placed on the side face of the cooler 13, and the column 35 is formed on the side face of the cooler 13. The semiconductor chip 21 is placed on the lower face of the cooler 13, and is joined to the lower face of the cooler 13. That is, the semiconductor chip 21 is joined to the face (lower face) of the cooler 13 different from the face (side face) to which the power supply portion 12 is joined.

Figure 16:
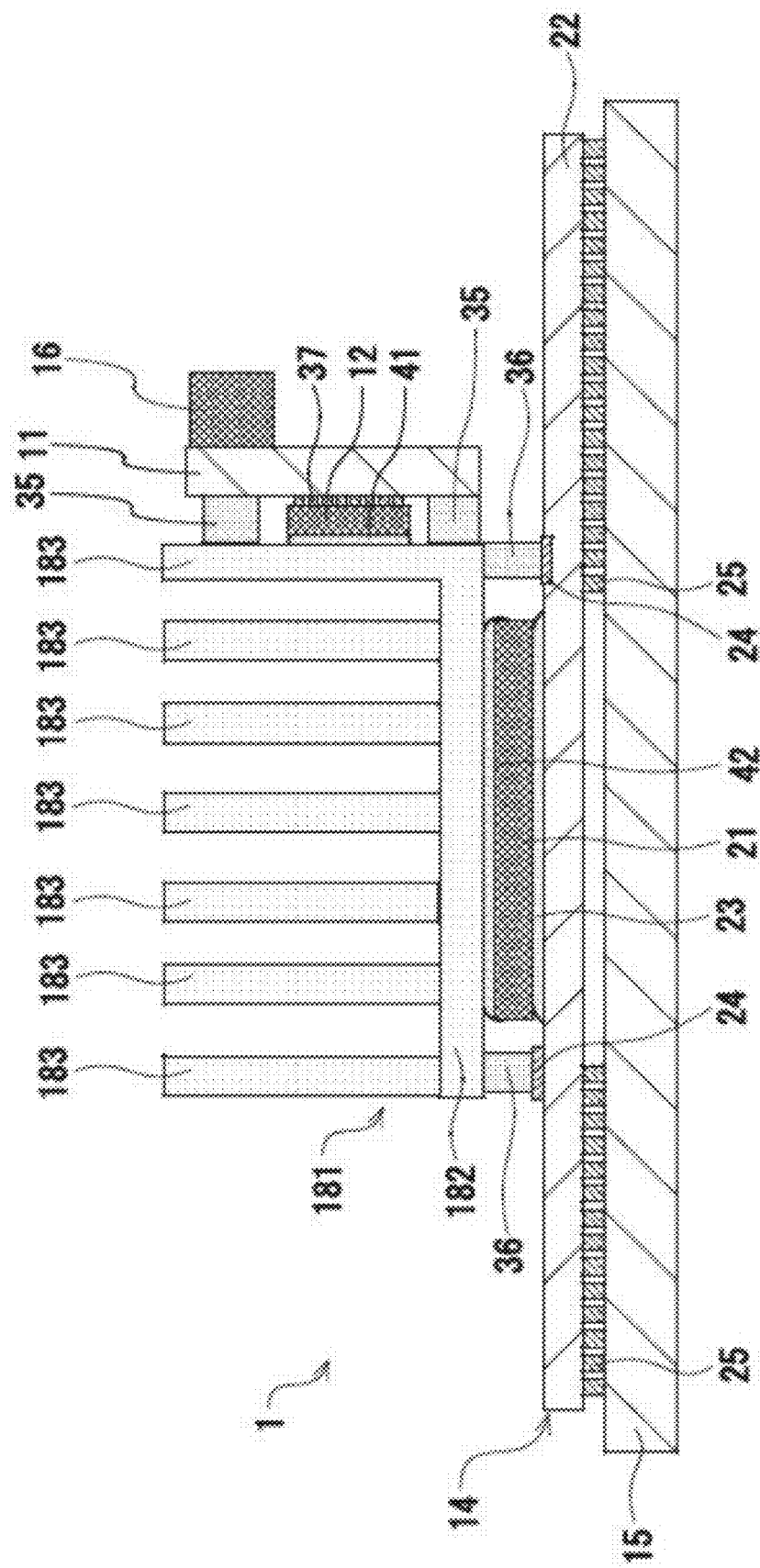
FIG. 16 is a diagram illustrating the package mounting structure according to Modification 1.

Furthermore, as illustrated in FIG. 16, the power supply portion 12 may be placed on a side face of a cooler (cooling device) 181, and be joined to the side face of the cooler 181. FIG. 16 is a diagram illustrating the package mounting structure 1 according to Modification 1. The cooler 181 is arranged on the semiconductor package 14. The cooler 181 has a heat spreader 182 and an air cooling fin 183. In the example which is illustrated in FIG. 16, the power supply substrate 11 is placed on the side face of the cooler 181, and the column 35 is formed on the side face of the cooler 181. The semiconductor chip 21 is placed on the lower face of the cooler 181, and is joined to the lower face of the cooler 181. That is, the semiconductor chip 21 is joined to the face (lower face) of the cooler 181 different from the face (side face) to which the power supply portion 12 is joined.

Modification 2

Figure 17:
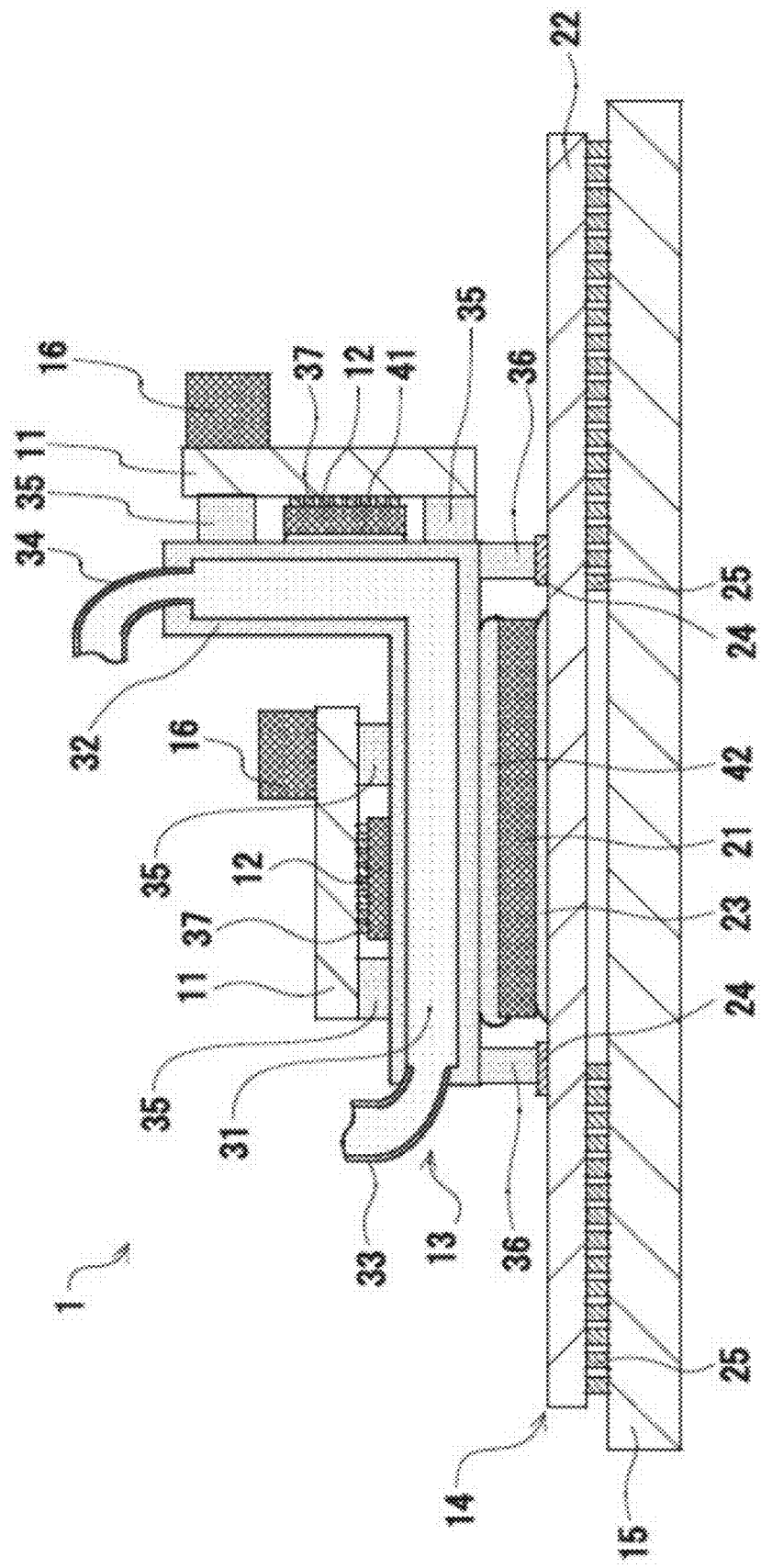
FIG. 17 is a diagram illustrating a package mounting structure according to Modification 2.

In Example 1, an example of arranging the single power supply substrate 11 on the cooler 13, is illustrated. Not limited to the example, the plurality of the power supply substrates 11 may be arranged on the cooler 13. For example, as illustrated in FIG. 17, the two power supply substrates 11 may be arranged on the cooler 13. FIG. 17 is a diagram illustrating the package mounting structure 1 according to Modification 2. In the example which is illustrated in FIG. 17, one of the power supply portions 12 is placed on the upper face of the cooler 13, and is joined to the upper face of the cooler 13. The other of the power supply portions 12 is placed on the side face of the cooler 13, and is joined to the side face of the cooler 13. In the example which is illustrated in FIG. 17, the power supply portions 12 are placed on the upper face and the side face of the cooler 13, and the columns 35 are formed on the upper face and the side face of the cooler 13. The semiconductor chip 21 is placed on the lower face of the cooler 13, and is joined to the lower face of the cooler 13. That is, the semiconductor chip 21 is joined to the face (lower face) of the cooler 13 different from the faces (upper face and side face) to which the power supply portions 12 are joined.

Moreover, the plurality of the power supply substrates 11 may be arranged on the cooler 181. For example, as illustrated in FIG. 18, the two power supply substrates 11 may be arranged on the cooler 181. FIG. 18 is a diagram illustrating the package mounting structure 1 according to Modification 2. In the example which is illustrated in FIG. 18, one of the power supply portions 12 is placed on the one side face of the cooler 181, and is joined to the one side face of the cooler 181. The other of the power supply portions 12 is placed on the other side face of the cooler 181, and is joined to the other side face of the cooler 181. In the example which is illustrated in FIG. 18, the power supply portions 12 are placed on the both side faces of the cooler 181, and the columns 35 are formed on the both side face of the cooler 181. The semiconductor chip 21 is placed on the lower face of the cooler 181, and is joined to the lower face of the cooler 181. That is, the semiconductor chip 21 is joined to the face (lower face) of the cooler 181 different from the faces (both side faces) to which the power supply portions 12 are joined.

According to Example 1 to Example 7, Modification 1 and Modification 2, it is possible to exclude the formation of the power layer on the system board 15, and it is possible to reduce the number of layers which the system board 15 has. Thereby, it is possible to promote densification and miniaturization of the system board 15. According to Example 1 to Example 7, Modification 1 and Modification 2, without going through the system board 15, it is possible to supply power to the electronic component of one type or the electronic components of the plurality of the types. Therefore, even when the electronic components having high power consumption are densely placed on the system board 15, it is possible to supply the power to the electronic component of one type or the electronic components of the plurality of the types. According to Example 1 to Example 7, Modification 1 and Modification 2, since the electronic component of one type or the electronic components of the plurality of the types, and the power supply portion 12 or the power supply portions 12A to 12D, are placed in three dimensions, it is possible to improve density of mounting in a projected area.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A package mounting structure comprising:
  a first substrate having a first wiring and a power supply unit, the power supply unit being electrically coupled to the first wiring;
  a second substrate having a second wiring and an electric component, the electric component being electrically coupled to the second wiring;
  a cooling unit arranged between the first substrate and the second substrate and having a first face and a second face different from the first face;
  a first column arranged on the first face of the cooling unit to electrically couple the first wiring and the cooling unit; and
  a second column arranged on the second face of the cooling unit to electrically couple the second wiring and the cooling unit, wherein
  the power supply unit is mounted on the first substrate and comes into contact with the first face of the cooling unit,
  the electronic component is mounted on the second substrate and comes into contact with the second face of the cooling unit, and
  the power supply unit supplies power to the electronic component through the first wiring, the first column, the cooling unit, the second column and the second wiring.

2. The package mounting structure according to claim 1, wherein
  a plurality of the power supply units are provided,
  the cooling unit has at least one flow path through which a refrigerant flows and a side wall which surrounds the flow path,
  the side wall of the cooling unit is electrically divided by an insulating portion to form a plurality of power paths in the cooling unit, and
  the plurality of the power supply units supply power to the electronic component through a plurality of power supply channels including the first wiring of the first substrate, the plurality of the power paths, and the second wiring of the second substrate.

3. The package mounting structure according to claim 1, wherein
  a plurality of the cooling units and a plurality of the power supply units are provided, and
  the plurality of the power supply units supply power to the electronic component through a plurality of power supply channels including the first wiring of the first substrate, the plurality of the cooling units, and the second wiring of the second substrate.

4. The package mounting structure according to claim 1, wherein
  a plurality of the power supply units and a plurality of the cooling units are provided,
  each of the plurality of the cooling units has a flow path through which a refrigerant flows and a side wall which surrounds the flow path,
  the side walls of the plurality of the cooling units are electrically divided by an insulating portion to form a plurality of power paths in the plurality of the cooling units, and
  the plurality of the power supply units supply power to the electronic component, through a plurality of power supply channels including the first wiring of the first substrate, the plurality of the power paths in the plurality of the cooling units, and the second wiring of the second substrate.

5. The package mounting structure according to claim 2, wherein plural types of the electronic components are provided.

6. The package mounting structure according to claim 2, wherein the cooling unit has a plurality of the flow paths.

* * * * *